(12) United States Patent
Coakley

(10) Patent No.: US 10,383,207 B2
(45) Date of Patent: Aug. 13, 2019

(54) INTERDIGITATED FOIL INTERCONNECT FOR REAR-CONTACT SOLAR CELLS

(71) Applicant: Kevin Michael Coakley, Belmont, CA (US)

(72) Inventor: Kevin Michael Coakley, Belmont, CA (US)

(73) Assignee: CELLINK CORPORATION, San Carlos, CA (US)

( * ) Notice: Subject to any disclaimer, the term of this patent is extended or adjusted under 35 U.S.C. 154(b) by 98 days.

(21) Appl. No.: 13/663,273

(22) Filed: Oct. 29, 2012

(65) Prior Publication Data

US 2013/0112233 A1  May 9, 2013

Related U.S. Application Data

(60) Provisional application No. 61/553,764, filed on Oct. 31, 2011, provisional application No. 61/597,309, (Continued)

(51) Int. Cl.
*H05K 3/36*     (2006.01)
*H05K 1/02*     (2006.01)
(Continued)

(52) U.S. Cl.
CPC ............. *H05K 1/02* (2013.01); *H01L 31/049* (2014.12); *H01L 31/0516* (2013.01);
(Continued)

(58) Field of Classification Search
CPC .......... H05K 1/02; H05K 1/189; H05K 1/113; H05K 3/202; H05K 2201/10143;
(Continued)

(56) References Cited

U.S. PATENT DOCUMENTS 3,903,427 A    9/1975  Pack
3,903,428 A    9/1975  DeJong
(Continued)

FOREIGN PATENT DOCUMENTS

CN   102113130 A   6/2011
CN   102132423 A   7/2011
(Continued)

OTHER PUBLICATIONS

Loctite. "Technical Data Sheet for Loctite 3888." Product 3888 (2003): 1-2. Loctite. Web. Aug. 8, 2015. <http://tds.loctite.com/tds5/docs/3888-EN.PDF>.*
(Continued)

*Primary Examiner* — Eli S Mekhlin
*Assistant Examiner* — Kourtney R S Carlson
(74) *Attorney, Agent, or Firm* — Kwan & Olynick LLP

(57) ABSTRACT

Layers of conductive foil and insulating material are configured to interconnect an array of rear-contact solar cells. An embodiment provides that the layer of conductive foil may be patterned to form repeating sets of electrically isolated, interdigitated fingers. Each set of interdigitated fingers may be used to connect the positive polarity contacts of a first rear-contact solar cell to the negative polarity contacts of a second, adjacent rear-contact cell. The insulating layer is attached to the patterned conductive foil and provides mechanical support and/or electrical isolation. In some embodiments, a protective backsheet may be disposed beneath the conductive foil and/or insulating layer to provide further mechanical support and environmental protection. In some embodiments, the layers of conductive foil and insulating material may be incorporated as an interconnect circuit in a rear-contact PV module.

25 Claims, 22 Drawing Sheets

Related U.S. Application Data filed on Feb. 10, 2012, provisional application No. 61/647,658, filed on May 16, 2012.

(51) Int. Cl.

| | | |
|---|---|---|
| *H01L 31/05* | (2014.01) | |
| *H05K 1/18* | (2006.01) | |
| *H05K 3/20* | (2006.01) | |
| *H01L 31/049* | (2014.01) | |
| *H05K 1/11* | (2006.01) | |

(52) U.S. Cl.
CPC ............. *H05K 1/189* (2013.01); *H05K 3/202* (2013.01); *H05K 1/113* (2013.01); *H05K 2201/10143* (2013.01); *H05K 2203/033* (2013.01); *H05K 2203/175* (2013.01); *Y02E 10/50* (2013.01); *Y10T 156/10* (2015.01)

(58) Field of Classification Search
CPC ........ H05K 2203/003; H05K 2203/175; H01L 31/049; H01L 31/0516
USPC .................................................. 136/242–265
See application file for complete search history.

(56) References Cited

U.S. PATENT DOCUMENTS

| | | | |
|---|---|---|---|
| 4,234,352 A | | 11/1980 | Swanson et al. |
| 4,927,770 A | | 5/1990 | Swanson |
| 5,053,083 A | | 10/1991 | Sinton |
| 6,160,215 A | | 12/2000 | Curtin |
| 6,210,637 B1 | * | 4/2001 | Uno et al. ..................... 420/508 |
| 6,500,731 B1 | | 12/2002 | Nakagawa et al. |
| 7,276,724 B2 | | 10/2007 | Sheats et al. |
| 8,975,510 B2 | | 3/2015 | Coakley |
| 2004/0144420 A1 | * | 7/2004 | Takeyama ......... H01L 31/02008 136/256 |
| 2007/0062573 A1 | | 3/2007 | Ferri et al. |
| 2008/0216887 A1 | * | 9/2008 | Hacke ................ H01L 31/0516 136/244 |
| 2009/0256254 A1 | | 10/2009 | Burdick, Jr. et al. |
| 2009/0301543 A1 | | 12/2009 | Reddy et al. |
| 2009/0314346 A1 | | 12/2009 | Hishida |
| 2010/0012172 A1 | | 1/2010 | Meakin et al. |
| 2010/0024881 A1 | | 2/2010 | Hacke et al. |
| 2010/0051085 A1 | | 3/2010 | Weidman et al. |
| 2010/0139746 A1 | | 6/2010 | Von Maydell et al. |
| 2010/0186804 A1 | | 7/2010 | Cornfeld |
| 2010/0300528 A1 | | 12/2010 | Fujii |
| 2011/0017278 A1 | * | 1/2011 | Kalkanoglu ............. E04D 1/26 136/251 |
| 2011/0048536 A1 | * | 3/2011 | Rivard et al. ................. 136/260 |
| 2011/0061724 A1 | * | 3/2011 | Houle et al. .................. 136/252 |
| 2011/0061735 A1 | * | 3/2011 | Nishijima ..................... 136/259 |
| 2011/0067751 A1 | | 3/2011 | Meakin et al. |
| 2011/0139210 A1 | | 6/2011 | Hong et al. |
| 2012/0000511 A1 | | 1/2012 | Gee et al. |
| 2012/0103388 A1 | | 5/2012 | Meakin et al. |
| 2012/0208411 A1 | * | 8/2012 | Krokoszinski .......... B32B 37/02 439/884 |
| 2012/0285501 A1 | * | 11/2012 | Zhao et al. ................... 136/244 |

FOREIGN PATENT DOCUMENTS

| | | |
|---|---|---|
| CN | 102473794 A1 | 5/2012 |
| CN | 103988283 A | 8/2014 |
| EP | 2774173 | 9/2014 |
| KR | 1020110008284 A | 1/2011 |
| WO | WO2005013322 A2 | 2/2005 |
| WO | 2009134939 A2 | 11/2009 |
| WO | WO2009134939 A3 | 11/2009 |
| WO | WO2011000629 A2 | 1/2011 |
| WO | 2013066884 A1 | 5/2013 |
| WO | WO 2013063738 A1 * | 5/2013 |

OTHER PUBLICATIONS

Van Kerschaver et al., Progress in Photovoltaics: Research and Applications, Back-contact Solar Cells: A Review, Wiley InterScience, 2005.
"U.S. Appl. No. 13/429,030, Final Office Action dated Aug. 15, 2014".
"U.S. Appl. No. 13/429,030, Notice of Allowance dated Oct. 29, 2014".
"Int'l Application Serial No. PCT/US12/62604, Search Report dated Jan. 17, 2013".
"Int'l Application Serial No. PCT/US2012/062604, Preliminary Report on Patentability dated May 15, 2014".
"European Application Serial No. 12846709.9, Search Report and written dated May 6, 2015".
"Chinese Application Serial No. 201280061209.8, Office Action dated Feb. 6, 2017", 4 pgs.
"Chinese Application Serial No. 201280061209.8, Office Action dated Nov. 27, 2018", 6 pgs.
"Chinese Application Serial No. 201280061209.8, Office Action dated Jun. 4, 2018", 20 pgs.

\* cited by examiner

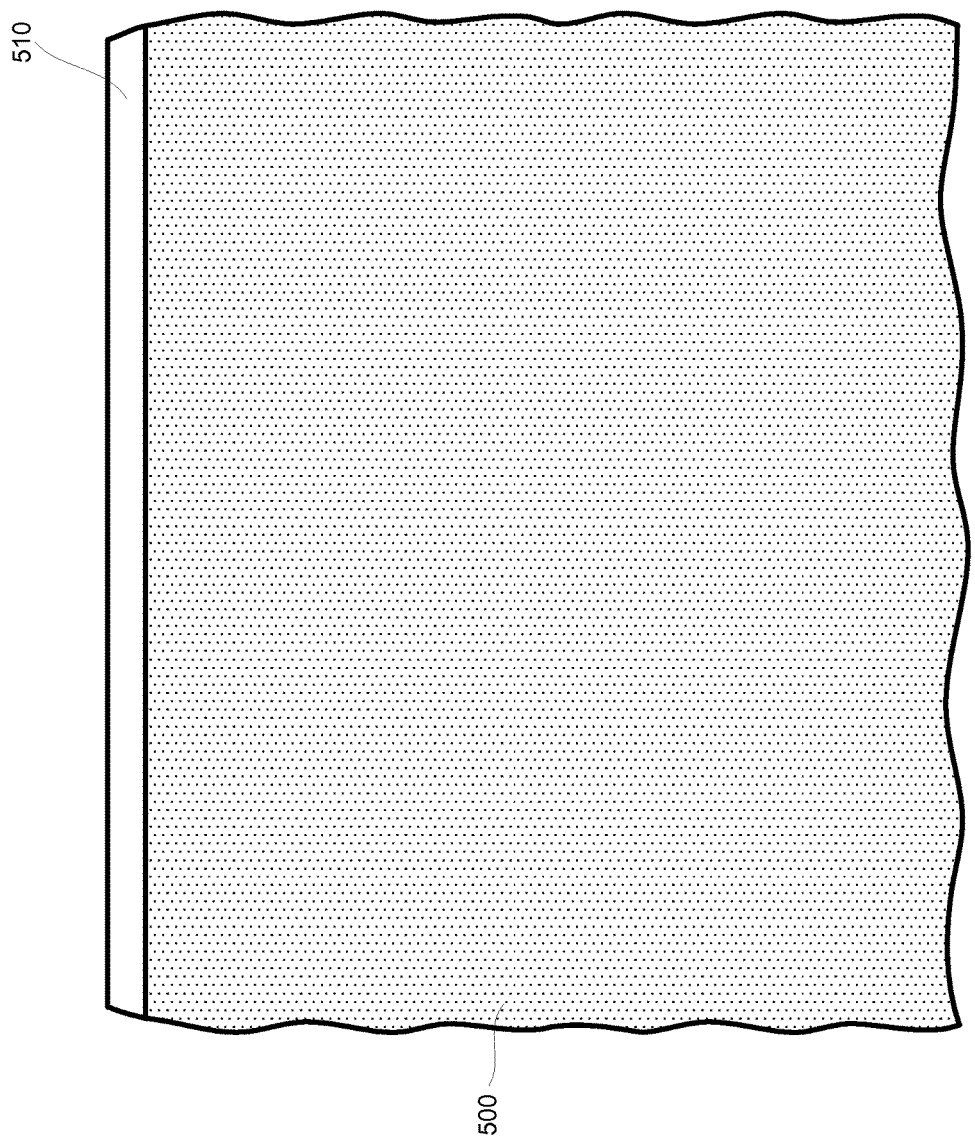

INTERDIGITATED FOIL INTERCONNECT FOR REAR-CONTACT SOLAR CELLS

CROSS-REFERENCE TO RELATED APPLICATIONS

This application claims priority to U.S. Provisional Patent Application No. 61/553,764 entitled FOIL-BASED INTERCONNECT FOR REAR-CONTACT SOLAR CELLS filed Oct. 31, 2011, U.S. Provisional Patent Application No. 61/597,309 entitled INTERDIGITATED FOIL INTERCONNECT FOR REAR-CONTACT SOLAR CELLS filed Feb. 10, 2012, and to U.S. Provisional Patent Application No. 61/647,658 entitled INTERDIGITATED FOIL INTERCONNECT FOR REAR-CONTACT SOLAR CELLS filed May 16, 2012, each of which are incorporated herein by reference for all purposes.

BACKGROUND OF THE INVENTION

In order to increase the efficiency and decrease the manufacturing cost of photovoltaic (PV) cells, significant efforts have been made to develop rear-contact solar cells in which both the positive and negative polarity contacts of the solar cell are accessible from the rear, or non-light-incident, side of the cell. Compared to traditional front-contact solar cells, rear-contact solar cells typically have less or in some cases no metal coverage of the cell's front surface. This circumvents the tradeoff that occurs in front-contact cells between the conductance of metallic front electrodes and their coverage (or shadowing) of the cell's light-incident side, leading to better optical in-coupling, lower resistive power loss, and higher conversion efficiency. Examples of rear-contact solar cells may be found in U.S. Pat. Nos. 3,903,427, 3,903,428, 4,927,770, 5,053,083, 7,276,724, and US patent applications US2009/0314346, US2010/0139746, and US2009/0256254. A thorough review of silicon-based rear-contact solar cell technology may be found in Prog. Photovolt: Res. Appl. 2006; 14:107-123.

In addition to providing higher efficiency, there are at least two other ways in which the incorporation of rear-contact solar cells can simplify and reduce the cost of manufacturing PV modules. First, in a rear-contact PV module production line it may be possible to replace the tabbing and stringing operation required in front-contact PV modules with a simple placement step in which rear-contact cells are directly connected to an electrically-functional "conductive backsheet" just prior to module lamination. This can help enhance the overall throughput of the production line. Second, for silicon-based PV cells, rear-contact PV modules are typically better-suited to the incorporation of thin, large cells than front-contact PV modules because front-contact silicon cells develop a large coefficient of thermal expansion (CTE) mismatch stress when thick current-collecting tabs are soldered to them. This CTE mismatch stress and associated cell breakage is particularly problematic if the cells are thinner than about 200 microns or larger than about 156 millimeters on a side. By contrast, the need for thick metallic conductors is significantly reduced in rear-contact solar cells because the output current is typically distributed across the back surface of the cell. This enables thinner, wider metallic conductors to be attached to the back of rear-contact solar cells with low ohmic power loss and reduced breakage from CTE mismatch stress.

At present, however, several factors related to the difficulty in interconnecting rear-contact solar cells have limited their widespread implementation. One factor arises from the challenging dimensional requirements involved in the interconnection process. In many rear-contact solar cell architectures it is desirable to have a contact spacing on the order of a few millimeters on the cell's rear surface, while the interconnected assembly of rear-contact solar cells is generally 1 $m^2$ or larger in a finished PV module. It is difficult to fabricate a single circuit or device that can accommodate both of these dimensional requirements with high yield and low cost. Prior art large-area conductive backsheets typically utilize a "flex circuit" process in which a layer of conductive foil is patterned into interdigitated positive and negative electrodes using mask and etch techniques (see, for example, US Patent App. No. 2010/0012172). In many cases the production cost of these conductive backsheets is so high that their use in PV modules becomes impractical. The high cost can be attributed in part to the relative lack of availability of screen printing and etching equipment that can handle 0.5-2 m wide rolls of material, and in part to the low throughput associated with etching thick metal foils.

In addition, achieving sufficient long-term reliability from rear-contact PV modules incorporating large-area conductive backsheets has been a challenge. For example, these devices may be prone to electrical shorting during fabrication and/or long-term outdoor exposure if an electrode of one polarity on the conductive backsheet touches an electrode of the opposite polarity on a rear-contact solar cell. In addition, although silicon solar cells are less likely to break during the module assembly of rear-contact PV modules than front-contact PV modules, in some cases CTE mismatch effects (e.g., between silicon solar cells and metallic foil conductors) in rear-contact PV modules can lead to the buildup of significant mechanical stress during day/night temperature cycling of the module. Over the long term this can lead to wrinkling and/or delamination of the conductive foil layer from the rear-contact solar cells, or, if the effect is severe enough, to the mechanical failure of the materials such as solder or electrically conductive adhesive (ECA) that are used to make electrical connections between the solar cells and conductive backsheet. This can potentially result in a significant reduction in power output from the rear-contact PV module.

BRIEF SUMMARY OF THE INVENTION

A first embodiment of the invention is an interconnect circuit comprising layers of conductive foil and insulating material. The interconnect circuit may be used to interconnect an array of rear-contact solar cells. The layer of conductive foil may be patterned to form repeating sets of electrically isolated, interdigitated fingers. Each set of interdigitated fingers may be used to connect the positive polarity contacts of a first rear-contact solar cell to the negative polarity contacts of a second, adjacent rear-contact cell. The insulating layer is attached to the patterned conductive foil and provides mechanical support and electrical isolation. Furthermore, in some embodiments a protective backsheet may be disposed beneath the interconnect circuit to provide additional mechanical support and environmental protection.

Other aspects include various methods of fabricating an interconnect circuit. In one embodiment, a method of fabricating an interconnect circuit comprises first forming a series of slots through a portion of conductive foil, then laminating the conductive foil to an insulating layer, and then slitting away the edges of the layers and/or removing connecting tabs to fully isolate adjacent regions of conductive foil. In another embodiment, the techniques and processes used to form an interconnect circuit that connects a linear array of rear-contact solar cells are extended to the fabrication of a two-dimensional interconnect circuit. In yet another embodiment, a method of fabricating an interconnect circuit comprises kiss cutting the conductive foil against a carrier substrate, then laminating the insulating layer to the conductive foil using a patterned adhesive, and then removing the carrier substrate along with undesired regions of conductive foil. Once completed, the interconnect circuit may optionally be laminated to a protective backsheet or connected to rear-contact solar cells for assembly into a solar module.

BRIEF DESCRIPTION OF THE DRAWINGS

Various embodiments are disclosed in the following detailed description and the accompanying drawings.

FIGS. 5A-5E are sequential plan view schematic diagrams illustrating examples of the fabrication of a two-dimensional interconnect circuit, in accordance with another embodiment of the invention.

Figure 1A:
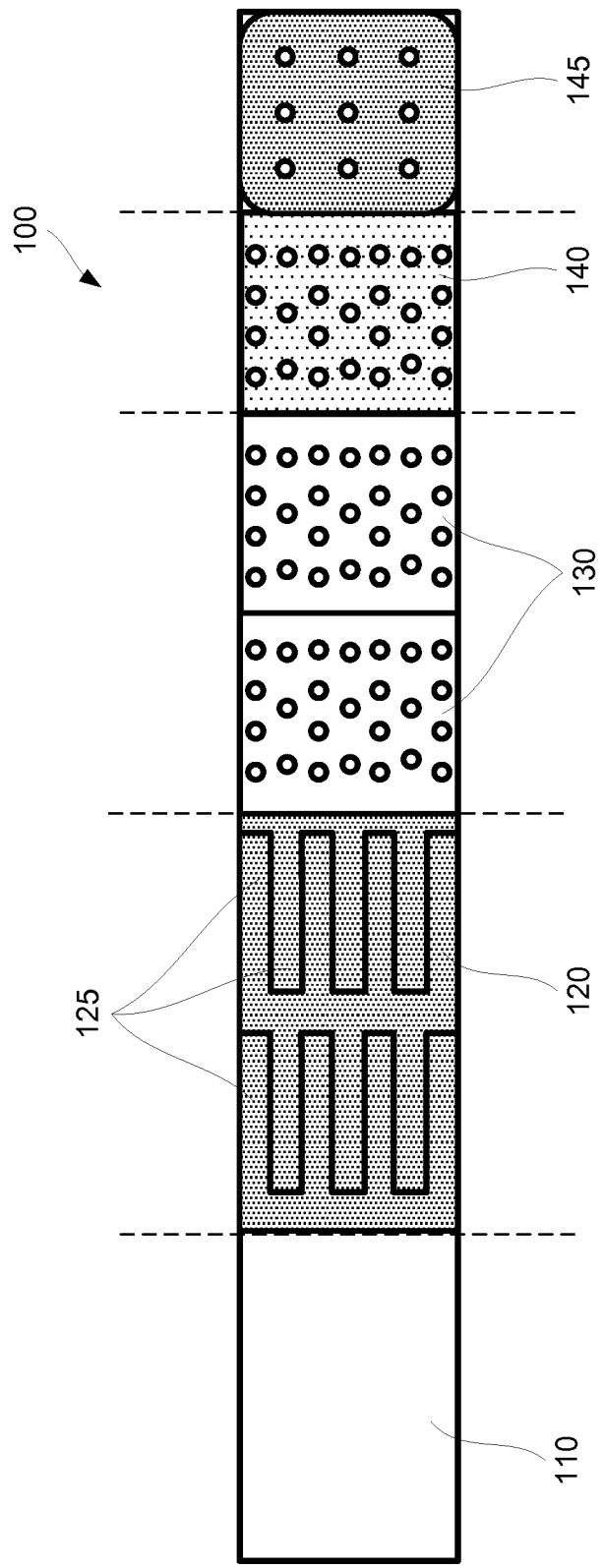
FIG. 1A is a sequential cutaway plan view schematic diagram illustrating an example of an interconnect circuit, in accordance with an embodiment of the invention.

The foregoing summary, as well as the following detailed description of certain embodiments of the presently described technology, will be better understood when read in conjunction with the appended drawings. For the purpose of illustrating the presently described technology, certain embodiments are shown in the drawings. It should be understood, however, that the presently described technology is not limited to the arrangements and instrumentality shown in the attached drawings. Moreover, it should be understood that the components in the drawings are not to scale and the relative sizes of one component to another should not be construed or interpreted to require such relative sizes.

DETAILED DESCRIPTION

The ensuing detailed description of specific embodiments of the invention will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Note that unless stated otherwise, within the detailed description a "front" surface of a layer generally refers to the surface facing the light-incident side of the rear-contact PV module, even if light is not directly incident on that particular surface; the "rear" surface refers to the surface of the layer facing away from the light-incident side of the module. Similarly, the words "upper", "top", and "above" are generally intended to convey a position closer to the light-incident side of the module, whereas the words "lower", "bottom", and "beneath" are intended to describe a position farther away. Furthermore, the term "opening" within the detailed description comprises any missing or absent material from a given layer, including but not limited to holes, slits, slots, or gaps of any shape or size, and independent of whether the missing material is fully or partially surrounded by material from the layer.

A first embodiment of the invention is an interconnect circuit that may be used to electrically connect a linear array of rear-contact solar cells in series. As shown in sequential cutaway plan view in FIG. 1A, the interconnect circuit 100 comprises an insulating layer 110, a conductive foil 120 which has been patterned to form repeating sets of interdigitated fingers 125, an optional dielectric isolation layer 130, and an optional second adhesive layer 140. In some embodiments the interconnect circuit 100 comprises at least one rear-contact solar cell 145, although in general the rear-contact solar cell 145 need not be present. The optional dielectric isolation layer 130 and second adhesive layer 140 may be patterned with arrays of openings to allow electrical connections to be made from the conductive foil 120 to the rear-contact solar cell 145. While the interconnect circuit 100 is depicted in FIG. 1A as being several times the length of a rear-contact solar cell 145, in practice the length of the circuit may range from 1 to 100 times the length of a rear-contact solar cell 145.

The insulating layer 110 provides electrical isolation and mechanical support to the conductive foil 120 and other overlying layers of the interconnect circuit 100. In some embodiments, the insulating layer 110 may initially be processed in sheet form and may subsequently be laminated to the conductive foil 120 using a first adhesive layer (not shown). Examples of sheet materials that may be suitable for the insulating layer 110 include, but are not limited to, polyimide (PI), polyethylene naphthalate (PEN), polyethylene terephthalate (PET), polymethyl methacrylate (PMMA), ethyl vinyl acetate (EVA), or polyvinyl butyral (PVB). The insulating layer 110 should generally be sufficiently electrically resistive to prevent lateral shunting between adjacent interdigitated fingers 125. Furthermore, the composition and thickness of the insulating layer 110 may be chosen to minimize distortion of the spacing between interdigitated fingers 125 that may occur during processing. This helps ensure that adjacent sets of interdigitated fingers 125 will be properly aligned with the contacts of the rear-contact solar cells 145. A thickness of the insulating layer 110 in the range 10-125 μm may be sufficient to satisfy this requirement. In some cases, the insulating layer 110 may comprise a multilayer stack of insulating layers or films. In some embodiments, a 10-100 micron thick layer of PET is used as the insulating layer 110 due to its low cost, good processability, and excellent electrical isolation characteristics.

The conductive foil 120 comprises any sufficiently electrically conductive material that can withstand typical process and field exposure conditions encountered by a rear-contact PV module. Materials suitable for the conductive foil 120 include, but are not limited to, aluminum, copper, steel, titanium, molybdenum, tungsten, and alloys thereof. The thickness of the conductive foil 120 should generally be large enough to provide a current path with low electrical resistance, yet not so large that excessively high CTE mismatch stress is generated in the finished assembly. In the case of aluminum or copper foils, a thickness in the range 10-200 µm may be sufficient to satisfy these criteria. In other embodiments, a foil thickness in the range 25-150 µm may be used. In still other embodiments, a 50-100 µm layer of aluminum foil may be used due to its good conductivity and low cost. The conductive foil 120 may be bonded to the insulating layer 110 using a first adhesive layer (not shown). Adhesive types that may be suitable for the first adhesive layer include but are not limited to pressure sensitive adhesives, contact adhesives, thermoplastic adhesives, cross-linking adhesives, UV curable adhesives, or two-component adhesives.

The conductive foil 120 may be at least partially coated with a surface finish material (not shown). The purpose of the surface finish material is to provide a stable, potentially solderable surface that prevents insulating oxides from forming at the interface between the conductive foil 120 and a conductive adhesive material (not shown) that connects the conductive foil 120 to the rear-contact solar cells 145. Surface finishes that may provide a suitable surface include, but are not limited to, tin, lead, zinc, nickel, silver, palladium, platinum, gold, indium, chrome, copper, alloys thereof, organic solderability preservative (OSP), or other electrically conductive materials. The surface finish material may be plated, sputtered, cold welded, or applied via other means. In some embodiments, the thickness of the surface finish may range from 0.05 microns to 10 microns. In other embodiments, a thickness in the range 0.1 microns to 2.5 microns may be used.

The use of a robust surface finish may be of particular importance if the conductive foil comprises aluminum or its alloys, since aluminum tends to form an insulating native oxide readily in the presence of oxygen or moisture. To provide a long-term stable surface in this case, the surface finish material should generally be resistant to the in-diffusion of oxygen and/or moisture. For example, zinc, silver, tin, copper, nickel, chrome, or gold plating may be particularly well-suited to the formation of an oxidation-resistant surface on aluminum.

Furthermore, in some applications it is desirable for conductive foil 120 to be solderable (e.g., in applications in which solder or solder paste is used in the formation of electrical connections to a rear-contact solar cell or in the attachment of busbars to the conductive foil). In the case of aluminum conductive foils it may be preferable for the melting temperature of the surface finish material to be well above the melting temperature of the solder. Otherwise, if the surface finish material melts during the melting of the solder, oxygen may penetrate into the molten surface finish layer and oxidize the aluminum surface, thereby reducing the conductivity at the interface and potentially causing a loss of mechanical adhesion. Hence in rear-contact PV modules, which generally benefit from a solder melting temperature below 350 C so that CTE mismatch effects may be minimized, zinc, silver, copper, nickel, chrome, or gold may be suitable surface finishes for conductive foil comprising aluminum.

Each set of interdigitated fingers 125 provides a continuous electrical pathway from the positive contacts of a first rear-contact solar cell to the negative contacts of a second, adjacent rear-contact solar cell. The layout of adjacent sets of interdigitated fingers 125 should generally at least partially match the pattern of positive and negative contacts on the rear surface of the rear-contact solar cell 145. The gap between interdigitated fingers 125 (i.e. the distance between the edge of one finger and the immediately adjacent edge of an adjacent finger) should generally be large enough to ensure good electrical isolation between adjacent sets of fingers, but small enough to leave a tolerance of around 0.5-1 millimeters for the placement of the rear-contact solar cell 145. Although the pattern of interdigitated fingers 125 depicted in FIG. 1 shows a square wave-like shape, in other embodiments the pattern may be varied to almost any other shape, with the general intent that the sets of interdigitated fingers 125 should be electrically isolated from each other and overlap the appropriate contacts on the rear surface of the rear-contact solar cell 145. For example, in embodiments in which the rear-contact solar cell 145 only has contacts near the cell edges, the length of the interdigitated fingers may be significantly less than the length of the rear-contact solar cells 145. Other potential reasons for varying the pattern of interdigitated fingers include, but are not limited to, A) reducing resistive power loss down the fingers; B) improving module yield by increasing the contact pad landing area near the contact openings; C) reducing mechanical stress on the interconnect circuit 100; or D) simplifying the fabrication process of the interconnect circuit 100.

In addition to the patterning of the conductive foil 120 with interdigitated fingers 125, in some embodiments additional openings may be formed in the conductive foil 120 (not shown) to help provide a degree of in-plane stress relief to the layer. Optionally, the conductive foil 120 may be selectively oxidized using, for example, photo-anodization to provide a protective insulating layer of metal oxide in regions of the foil that do not make electrical contact with conductive adhesives and/or the rear-contact solar cells 145.

The optional dielectric isolation layer 130 provides electrical isolation between adjacent sets of interdigitated fingers 125 as well as between the interdigitated fingers 125 and the rear-contact solar cell 145. Openings may be patterned in the dielectric isolation layer 130 in regions where electrical conduction between the conductive foil 120 and the rear-contact solar cell 145 is desired (e.g. near the contact points of the rear-contact solar cell 145). Note that in cases in which a printable electrical connection material such as silver-filled epoxy or solder paste is used to connect the conductive foil 120 to the rear-contact solar cell 145, the presence of a dielectric isolation layer 130 may help prevent electrical shorts between adjacent interdigitated fingers 125 if excessive spreading of the electrical connection material occurs during processing. In some embodiments, the dielectric isolation layer 130 may comprise a printable material that may be deposited using screen printing, flexo printing, inkjet printing, gravure printing, or other printing techniques. In embodiments in which the second adhesive layer 140 is sufficiently electrically insulating and mechanically robust, it may not be necessary to include the dielectric isolation layer 130 in the interconnect circuit 100. This may help reduce the manufacturing cost of the interconnect circuit 100.

The second adhesive layer 140 provides an adhesive bond between the rear-contact solar cell 145 and the underlying interconnect circuit 100. As in the case of the dielectric isolation layer 130, openings may be patterned in the second adhesive layer 140 to allow electrical contact to be made between the conductive foil 120 and the rear-contact solar cell 145. The second adhesive layer 140 should generally have a sufficiently high electrical resistance so as not to laterally shunt together nearby contact points on the interconnect circuit 100 or on the rear-contact solar cell 145. Adhesive types that may be suitable for the second adhesive layer 140 include, but are not limited to, pressure sensitive adhesives, contact adhesives, thermoplastic adhesives, cross-linking adhesives, UV curable adhesives, two-component adhesives, B-stage adhesives, thermoset adhesives, or traditional PV encapsulants. Optionally, a pigment may be added to the second adhesive layer 140 to improve the reflectivity of the interconnect circuit 100.

In some embodiments, the second adhesive layer 140 may first be applied to either the conductive foil 120 or the rear-contact solar cell 145 in initially liquid form (i.e., from a molten state or from solution) using a printing technique such as screen printing, flexo printing, inkjet printing, gravure printing, or some other printing technique. Because an adhesive that is initially in a liquid state may flow before it has solidified/dried, in some embodiments the application of the second adhesive layer 140 in liquid form may be able to help fill any voids or gaps in the underlying layers (e.g., between the interdigitated fingers 125) or smooth out any protrusions or sharp edges present (e.g., at the edges of the conductive foil 120). This may help improve the yield and/or long-term reliability of the rear-contact PV module. Alternatively, the second adhesive layer 140 may be provided in sheet form and then laminated to either the conductive foil 120 or the rear contact solar cell 145. In these embodiments, openings may optionally be patterned in the second adhesive layer 140 prior to lamination using rotary die cutting, match-metal die cutting, male/female die cutting, flat bed die cutting, punching, laser cutting, or other removal techniques. In still other embodiments, the second adhesive layer 140 may be laminated to either the conductive foil 120 or the rear-contact solar cell 145 as a continuous sheet, followed by the formation of openings in the second adhesive layer 140 using a removal technique such as etching or laser ablation.

The desired thickness of the second adhesive layer 140 may range from 10 to 500 microns depending on the properties of the layer and the process techniques and materials used in fabricating the rear-contact PV module. In embodiments in which the electrical connection material used in the openings of the second adhesive layer 140 is costly (as can be the case, for example, with a silver-based conductive epoxy, which may cost on the order of $1/g), the overall cost of the rear-contact PV module may generally be reduced by reducing the thickness of the second adhesive layer 140. This decreases the volume of electrical connection material required to fill the openings in the second adhesive layer 140 and make contact between the conductive foil 120 and the rear-contact solar cell 145. For example, a second adhesive layer 140 thickness between 1 micron and 200 microns may be used to help reduce the required amount of electrical connection material. In other embodiments, a thickness between 1 micron and 100 microns may be used. In still other embodiments, a layer thickness between 1 micron and 50 microns may be used.

However, a potential challenge associated with using a relatively thin second adhesive layer 140 is that during module lamination there may be insufficient adhesive material present to fill all the voids or gaps in the layer stack (such as the gaps in between the interdigitated fingers), or to prevent any protrusions or sharp edges in the conductive foil from pushing all the way through the adhesive and electrically shorting to a rear-contact solar cell. In some embodiments, these issues may potentially be addressed by either A) applying the second adhesive layer 140 in initially liquid form (e.g. by screen printing, gravure printing, etc.), so that it tends to fill any gaps (or smooth over protrusions) during the application of the adhesive; or B) by providing an additional planarizing layer between the conductive foil 120 and the rear-contact solar cell 145 to help eliminate gaps or protrusions between the two. Each of these embodiments is discussed elsewhere in the description.

Due to the relatively large CTE mismatch between a semiconductor such as silicon and many conductive foils, in some cases there may be a tendency of the conductive foil 120 to wrinkle and/or delaminate from the rear-contact solar cell 145 during long-term day/night temperature cycling of a rear-contact PV module. Conductive foils comprising aluminum may be particularly susceptible to this effect relative to conductive foils comprising copper, due to the higher CTE (23 ppm/C versus 17 ppm/C) and higher electrical resistivity (2.8E-6 ohmcm versus 1.7E-6 ohmcm) of aluminum. (While not in and of itself problematic, the higher resistivity of aluminum generally means that if a given electrical sheet resistance is desired, a thicker aluminum foil layer is required to generate the same electrical sheet resistance as copper, which can lead to increased mechanical stress in the layer stack.) To help prevent wrinkling in the conductive foil, in some embodiments the second adhesive layer 140 may be a thermoplastic adhesive/encapsulant that is pre-selected according to its melt flow index (MFI, as defined by ASTM D1238, 2.16 kg, 190 C). The MFI of thermoplastic adhesives/encapsulants may range from less than 1 dg/min at 190 C, in which case there is very little flow of the adhesive under applied force/stress, to more than 50 dg/min, in which case the adhesive tends to flow rapidly. Although rear-contact PV modules do not typically encounter temperatures as high as 190 C in outdoor use, in some embodiments the MFI may be used as a predictor of the tendency of the second adhesive layer 140 to creep during long-term operation.

Whereas a thermoplastic adhesive with an MFI above 20 dg/min is typically more susceptible to creep—and therefore more likely to lead to wrinkling in the conductive foil 120—than STR® Photocap® EVA 15420 (a widely-utilized commercially-available cross-linking EVA encapsulant), a thermoplastic adhesive with an MFI below 10 dg/min may be much better able to prevent wrinkling in conductive foils than the aforementioned cross-linked EVA product. In some embodiments, a second adhesive layer 140 with a MFI of about 4 dg/min or less may enable a 50- to 100-micron-thick aluminum conductive foil to be used in a rear-contact PV module without significant wrinkling during day/night temperature cycling. In other embodiments, a second adhesive layer 140 with a MFI of about 8 dg/min or less may be sufficient. Note that the correlation of the MFI of the second adhesive layer 140 with the tendency of the conductive foil 120 to wrinkle may be directly measured by quantifying the degree of wrinkling in the conductive foil layer following several hundred (e.g., 400-800) −40 C to +85 C temperature cycles of a rear-contact PV module, a well-known test in the PV industry.

A potential challenge associated with using a low-MFI second adhesive layer 140 in a rear-contact PV module is that during module lamination at typical process temperatures and durations (e.g., 120-160 C for 5-60 minutes), the adhesive may not flow significantly enough to fill voids or gaps in the layer stack. Similar to the issues encountered when using a relatively thin second adhesive layer 140 as described above, in some embodiments these issues may be addressed by either A) applying the second adhesive layer 140 in initially liquid form (e.g. by screen printing, gravure printing, etc. from a molten or dissolved state), so that the adhesive tends to fill any gaps (or smooth over protrusions) during its application; or B) providing an additional planarizing layer between the conductive foil 120 and the rear-contact solar cell 145 to remove gaps and smooth protrusions between the two, so that the second adhesive layer 140 is not required to flow substantially.

A series of electrical connections (not shown) may be made between the conductive foil 120 and the rear-contact solar cell 145 via the openings in the optional dielectric isolation layer 130 and the second adhesive layer 140. In some embodiments, the conductive foil 120 may be pressed directly into contact with the rear-contact solar cell 145 in these locations, while in other embodiments an electrical connection material may be used to make contact. Materials which are potentially suitable to make the electrical connections include, but are not limited to, solders, solder pastes, conductive inks, isotropic ECAs, anisotropic ECAs, and bulk metallic conductors. In some embodiments, the electrical connections comprise a material that may be printed or dispensed such as solder paste or silver flake-filled, epoxy-based ECA.

In some embodiments, it is desirable for the materials used to make the electrical connections to be resistant to interfacial and bulk oxidation in the event that these regions are exposed to oxygen or moisture during module operation. In some cases, resistance to corrosion and/or oxidation may be enhanced through the inclusion of a corrosion inhibitor in the electrical connection material. The use of a corrosion inhibitor may be of particular importance if the top surface of the conductive foil 120 (i.e., the surface finish material, or in the absence of a surface finish material, the conductive foil itself) has a more negative reduction potential (i.e., a greater tendency to be oxidized) than the conducting substance in the electrical connection. For example, if the electrical connection material is a silver flake-filled ECA, surface finish materials and/or conductive foils comprising metals such as tin, lead, zinc, nickel, silver, palladium, indium, aluminum, or copper may benefit from the presence of a corrosion inhibitor. The general function of a corrosion inhibitor is to form a protective, yet non-electrically insulating, layer on the surface of the surface finish or conductive foil that acts as a barrier to oxidation. For example, a chelating agent such as an amino acid or other carboxylic acid-containing molecule may be used as a corrosion inhibitor in the electrical connection material.

The rear-contact solar cell 145 comprises any type of solar cell in which both the positive and negative contacts are accessible from the rear surface of the solar cell. The rear-contact solar cell 145 may be patterned such that its positive and negative contacts are arranged in alternating rows and/or columns. This can help ensure that each of the interdigitated fingers 125 will be able to reach all of the contacts of a given polarity type across the rear face of the rear-contact solar cell 145. In some embodiments, the rear-contact solar cells 145 may be fabricated from mono- or multi-crystalline silicon wafers. Examples of silicon rear-contact solar cells that may be incorporated into a rear-contact PV module include, but are not limited to, metal wrap-through cells, emitter wrap-through cells, back junction cells, all-back-contact cells, interdigitated back-contact cells, rear-contact-adapted passivated emitter rear locally-diffused cells, rear point-contact cells, rear-contact-adapted silicon heterojunction (also known as heterojunction with intrinsic thin layer, or HIT) cells, and rear-contact-adapted concentrator cells. A typical non-concentrating silicon-based rear-contact solar cell may range from 10 to 300 microns in thickness and from 100 to 450 millimeters in width and/or diameter.

In some embodiments, the relative positions of the insulating layer and the patterned conductive foil may be reversed in the layer stack of the interconnect circuit. An example of an interconnect circuit in this configuration, referred to herein as the "upside-down configuration", is depicted in sequential cutaway plan view in FIG. 1B. The rear layer of an upside-down interconnect circuit 102 comprises conductive foil 122 that has been patterned to form repeating sets of interdigitated fingers 127. An insulating layer 112 and optional second adhesive layer 142 are disposed above the conductive foil 122. The upside-down interconnect circuit 102 may also include at least one rear-contact solar cell 147, although in general the rear-contact solar cell 147 need not be present. In the embodiment depicted in FIG. 1B, the insulating layer 112 and second adhesive layer 142 have been patterned with arrays of openings to allow electrical connections to be made from the conductive foil 122 to the rear-contact solar cell 147.

Figure 1B:
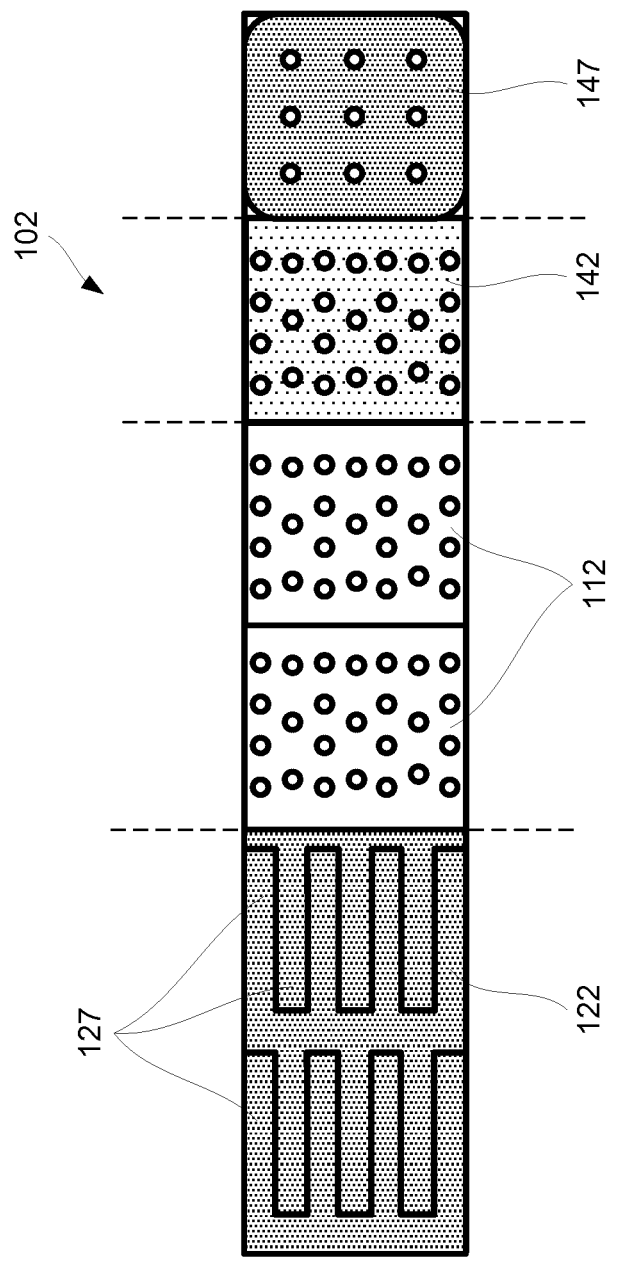
FIG. 1B is a sequential cutaway plan view schematic diagram illustrating an example of an interconnect circuit in the upside-down configuration, in accordance with another embodiment of the invention.

There are at least two potential advantages to the upside-down configuration depicted in FIG. 1B. First, in some embodiments (such as the embodiment shown in FIG. 1B), the insulating layer 112 may be used as a substitute for a dielectric isolation layer, thereby reducing the total number of layers and reducing the manufacturing cost of the upside-down interconnect circuit 102. Second, the insulating layer 112 may act as a planarizing surface that helps eliminate protrusions, voids, or gaps between the rear-contact solar cell 147 and the other layers of the interconnect circuit 102.

In embodiments in which the electrical connection material used to fill the openings in the insulating layer 112 and/or second adhesive layer 142 is costly, the overall cost of the rear-contact PV module may generally be reduced by reducing the thickness of the insulating layer 112 and/or second adhesive layer 142, as described above. Furthermore, unless stated otherwise, it is intended that embodiments describing features of the interconnect circuit 100 of FIG. 1A, process techniques used to fabricate the interconnect circuit 100, or methods and/or device structures used to incorporate the interconnect circuit 100 into a conductive backsheet and/or a rear-contact PV module may optionally also be applied to the upside-down interconnect circuit 102 of FIG. 1B, and vice versa.

Figure 1C:
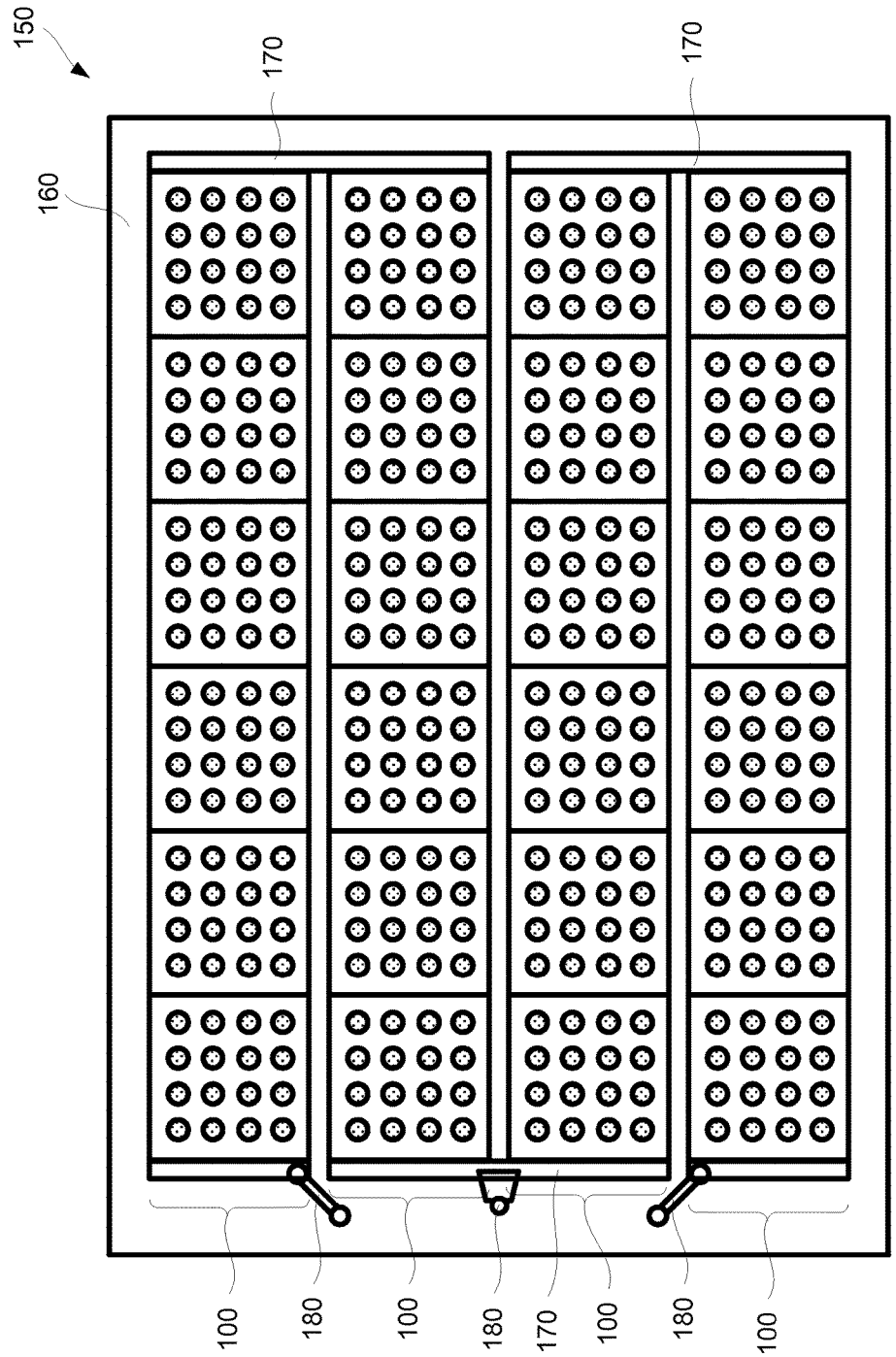
FIG. 1C is a plan view schematic diagram illustrating an example of a conductive backsheet, in accordance with another embodiment of the invention.

Another embodiment is a conductive backsheet 150 comprising one or more interconnect circuits 100. FIG. 1C is a plan view diagram illustrating a conductive backsheet 150 in accordance with this embodiment. As shown in the figure, one or more interconnect circuits 100 are disposed above a protective backsheet 160. Connecting busbars 170 electrically connect adjacent interconnect circuits 100 in series. External connectors 180 pass current through the conductive backsheet 150 to a junction box or other external terminal.

The protective backsheet 160 may comprise some or all of the layers found in traditional front-contact PV backsheets such as Tedlar®, PET, EVA primer, polyethylene, and the like, while in other embodiments the protective backsheet 160 may be fabricated from entirely new materials. Similarly, the protective backsheet may be commercially available in some embodiments, or may be made custom or in-house in others. The purpose of the protective backsheet 160 is to provide mechanical and environmental protection from the outside environment. In addition, the protective backsheet 160 may comprise a continuous layer of insulating material (such as PET, for example) to prevent high voltage discharge through the backsheet when several rear-contact PV modules are connected in series.

In the upside-down configuration, the rear surface of the interconnect circuit 102 (as shown in FIG. 1B) comprises patterned conductive foil 122. When an upside-down interconnect circuit 102 is attached to a protective backsheet, in some embodiments the top layer of the protective backsheet may comprise an adhesive that is sufficiently thick and mobile that it flows into the gaps in the conductive foil 122 (for example, into the spaces in between the interdigitated fingers 127) during heated lamination step(s), thereby helping to remove voids from the layer stack. For example, an adhesive layer thickness that is at least 50% of the thickness of the conductive foil 122 may be sufficient to flow into the gaps in the conductive foil 122 and remove voids from the layer stack. In other embodiments, an adhesive layer thickness that is approximately at least the same as the thickness of the conductive foil 122 may be sufficient (e.g. if the conductive foil is 100 microns thick, the adhesive layer may be approximately 100 microns thick or greater).

To this end, a number of commercially available "TPE" protective backsheets comprise a top adhesive layer that may be sufficiently thick and mobile to flow into the gaps in the conductive foil 122. However, many of the top adhesive layers in TPE backsheets (for example, polyolefin, polyethylene, non-cross-linking EVA, or other low-temperature thermoplastic adhesive layers) are initially of a non-permanent nature. If these layers are bonded directly to an interconnect circuit 102 during a lamination step, in many cases the bond will fail shortly thereafter, even if the adhesive layer is sufficiently thick to fill the gaps in the conductive foil 122. For example, if a Madico TPE HD protective backsheet is laminated directly to an upside-down interconnect circuit 102, the bond may fail after only a few (e.g. less than 10) hours in 85 C/85% RH aging. To overcome this issue, in some embodiments a thin, adhesion-promoting tie layer (not shown) may be applied to the top adhesive layer of the protective backsheet 160 and/or the bottom of the interconnect circuit 102 prior to lamination. This helps form a relatively permanent bond between the protective backsheet 160 and the interconnect circuit 102. In the example given above, the application of a 1- to 10-micron-thick tie layer to the top adhesive layer of the protective backsheet 160 prior to bonding with the interconnect circuit 102 can extend the lifetime of the bond to more than three thousand hours in 85 C/85% RH aging, essentially forming a near-permanent bond using an adhesive that is initially of a non-permanent nature. In some embodiments, a sufficiently strong bond may be achieved using a tie layer thickness that is less than approximately 20% of the thickness of the top adhesive layer of the protective backsheet 160. In other embodiments, the tie layer thickness may be less than around 10% of the thickness of the top adhesive layer.

Material types that may be suitable for the tie layer include, but are not limited to, pressure sensitive tie layers, thermoplastic tie layers, thermoset tie layers, cross-linking tie layers, UV curable tie layers, two-component tie layers, or other materials. In some embodiments, a cross-linking tie layer may be used. In addition, in some embodiments, the aforementioned tie layer materials may optionally also be used in bonding a base-configuration interconnect circuit 100 (as shown in FIG. 1A) to a protective backsheet 160.

The connecting busbars 170 provide a series connection between adjacent interconnect circuits 100. While in some embodiments the conducting busbars 170 are disposed above the interconnect circuits 100 and hence may be attached to the interconnect circuits 100 either before or after the interconnect circuits 100 have been laminated to the protective backsheet 160, in other embodiments the conducting busbars 170 are disposed beneath the interconnect circuits 100 and may be attached to the interconnect circuits prior to (or during) the lamination of the interconnect circuits 100 to the protective backsheet 160. Techniques which may be used to attach the connecting busbars 170 to the interconnect circuits 100 include, but are not limited to, soldering, brazing, ultrasonic welding, laser welding, or bonding with conductive adhesives such as PSAs or epoxies.

In some embodiments, stress-relieving properties such as gaps, openings, or other flexibility-creating structures may be included in the design of the connecting busbars 170. This may help reduce the buildup of stress on the connecting busbars 170 during day/night thermal cycling. In addition, in some embodiments the connecting busbars 170 may be attached using a two-step process (not shown) in which first busbars are attached to the ends of each interconnect circuit 100 (not shown), and second connecting busbars are used to make a simple electrical connection between two adjacent first busbars.

External connectors 180 pass electrical current from the terminals of the interconnect circuits 100 and/or connecting busbars 170 to the outside of the module. The external connectors 180 may provide contact points for the attachment of bypass diodes in between adjacent interconnect circuits 100. In some embodiments, external connectors 180 are attached to the connecting busbars 170 and interconnect circuits 100 after the connecting busbars 170 and interconnecting circuits 100 have been attached to the protective backsheet 160, while in other embodiments the external connectors 180 are attached to the connecting busbars 170 and interconnect circuits 100 before (or during) the incorporation of these devices into the conductive backsheet 150. Alternatively, some or all of the external connectors 180 and/or connecting busbars 170 may be integrated into one or more external connector assemblies (not shown) prior to their connection to the interconnect circuits 100. This may simplify the series connection of the interconnect circuits 100.

Figure 1D:
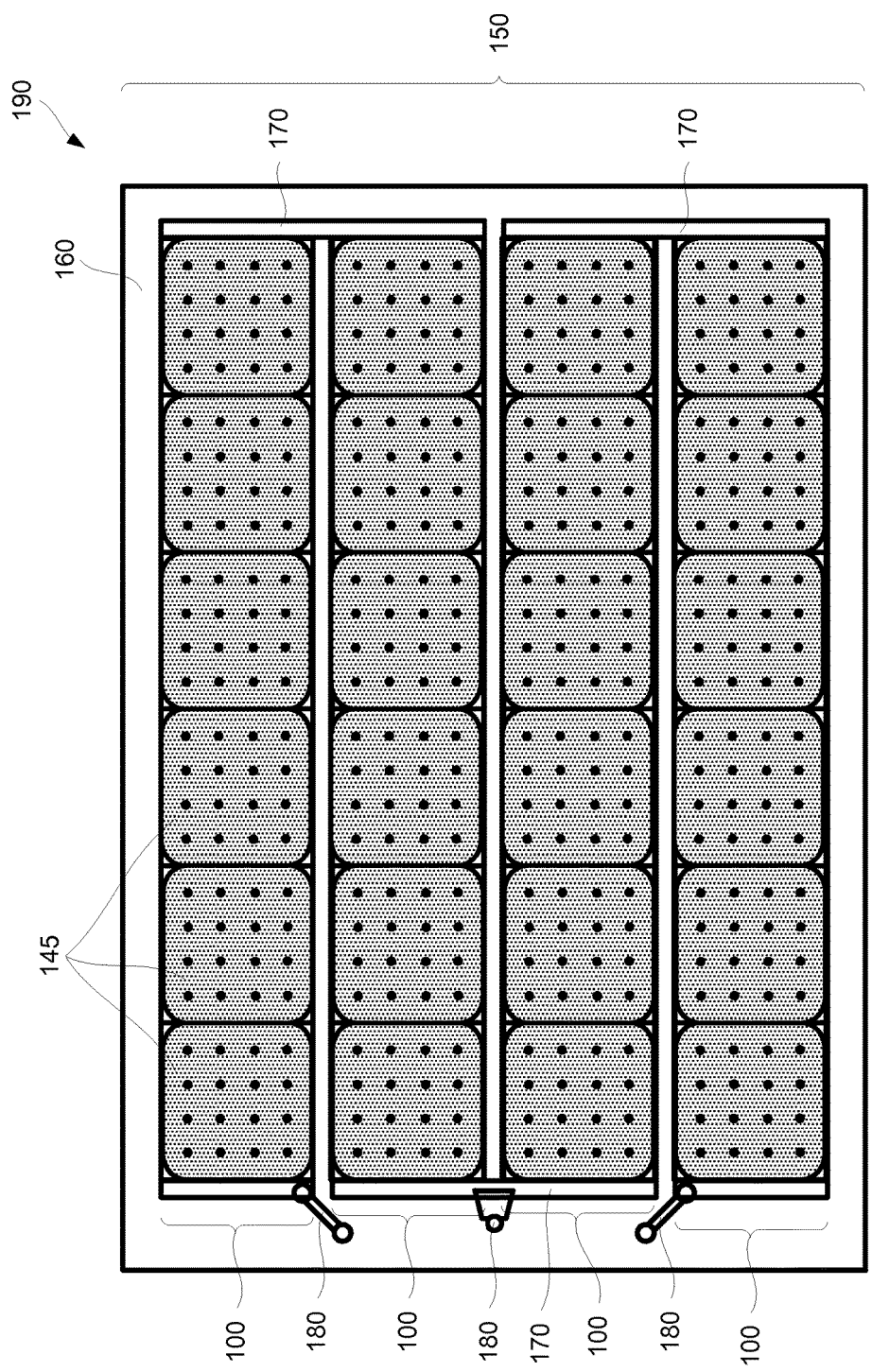
FIG. 1D is a plan view schematic diagram illustrating an example of a rear-contact PV module, in accordance with another embodiment of the invention

Another embodiment is a rear-contact PV module 190 comprising a conductive backsheet 150 and one or more rear-contact solar cells 145, as shown in the plan view drawing in FIG. 1D. The rear-contact PV module 190 may optionally further comprise a protective backsheet, encapsulant materials, a rear junction box, a frame, and a transparent cover sheet such as low-iron tempered glass (not shown). In some embodiments, traditional methods such as vacuum lamination may be used to fabricate the rear-contact PV module, however in place of the traditional tabbing and stringing step the rear contact solar cells 145 may simply be placed on the interconnect circuits 100 using a pick-and-place robot, for example.

Prior to placement of the rear-contact solar cells 145 on the conductive backsheet 150, electrical connection materials (not shown) may optionally be applied in the openings in the second adhesive layer and/or the dielectric isolation layer to electrically connect the rear-contact solar cells 145 to the interconnect circuits 100. Techniques which may be used to electrically connect the rear-contact solar cells 145 to the interconnect circuits 100 include, but are not limited to, soldering, brazing, laser welding, or bonding with conductive adhesives such as PSAs or silver-loaded epoxies.

In embodiments in which a second adhesive layer has not been incorporated during the fabrication of the interconnect circuit 100 and/or conductive backsheet 150, an adhesive or encapsulant layer (not shown) may optionally be applied to the conductive backsheet 150 prior to placement of the rear-contact solar cells 145 and/or the conductive adhesive materials. Openings may be formed in the sheet to allow electrical connections to be made between the interconnect circuits 100 and the rear-contact solar cells 145. Adhesive/encapsulant materials which may be used to bond the interconnect circuits 100 to the rear-contact solar cells 145 in these embodiments include, but are not limited to, EVA, PVB, polyolefin, polyurethane, or silicone.

In still other embodiments, the rear-contact PV module comprises interconnect circuits 100 and rear-contact solar cells 145, but does not include a protective backsheet 160. Such a rear-contact PV module (not shown) may be fabricated using interconnect circuits 100 laminated to a rear sheet of glass instead of a protective backsheet 160, for example.

Although the interconnect circuits shown in FIGS. 1A-1D are depicted as connecting a linear array of rear-contact solar cells, interconnect circuits that connect rear-contact solar cells in two dimensions (e.g., in a serpentine pattern for series connection throughout the rear-contact PV module) are also considered to be embodiments. A method of fabricating two-dimensional interconnect circuits will be described below.

A potential advantage to constructing the interconnect circuit as a separate component from the protective backsheet is that it allows for a decoupling of the functions of each. Since the purpose of the interconnect circuit (providing electrical connections) is generally different from the purpose of the protective backsheet (providing chemical, mechanical and electrical isolation from the surrounding environment), separating these two components may, in some embodiments, yield a more robust PV module. Furthermore, this separation may provide a supply chain advantage: The maker of the interconnect circuit and/or conductive backsheet may optionally rely on commercially available protective backsheets rather than developing its own. To this end, several commercially available protective backsheets (for example, 3M Scotchshield Film™, Madico TPE HD, and Dunmore Dun-Solar™ TPE) have been shown to be compatible with interconnect circuits 100 and upside-down interconnect circuits 102.

In addition, two other advantages may potentially be derived from the incorporation of the interconnect circuit as a separate component from the protective backsheet. First, in some embodiments connecting busbars may be attached behind the interconnect circuit (i.e., between the interconnect circuit and the protective backsheet). This may help reduce the inactive area near the module edges typically reserved for bus connections, thereby leading to an increase in module efficiency. Second, it is straightforward to pattern the interconnect circuit at a slightly smaller size than the size of the protective backsheet. This enables an electrically-isolating gap (or perimeter) to be maintained between the interconnect circuit and the edges of the protective backsheet (and, therefore, the edge of the rear-contact PV module) without requiring complex process steps or generating waste trim in the interconnect circuit.

Figure 2A:
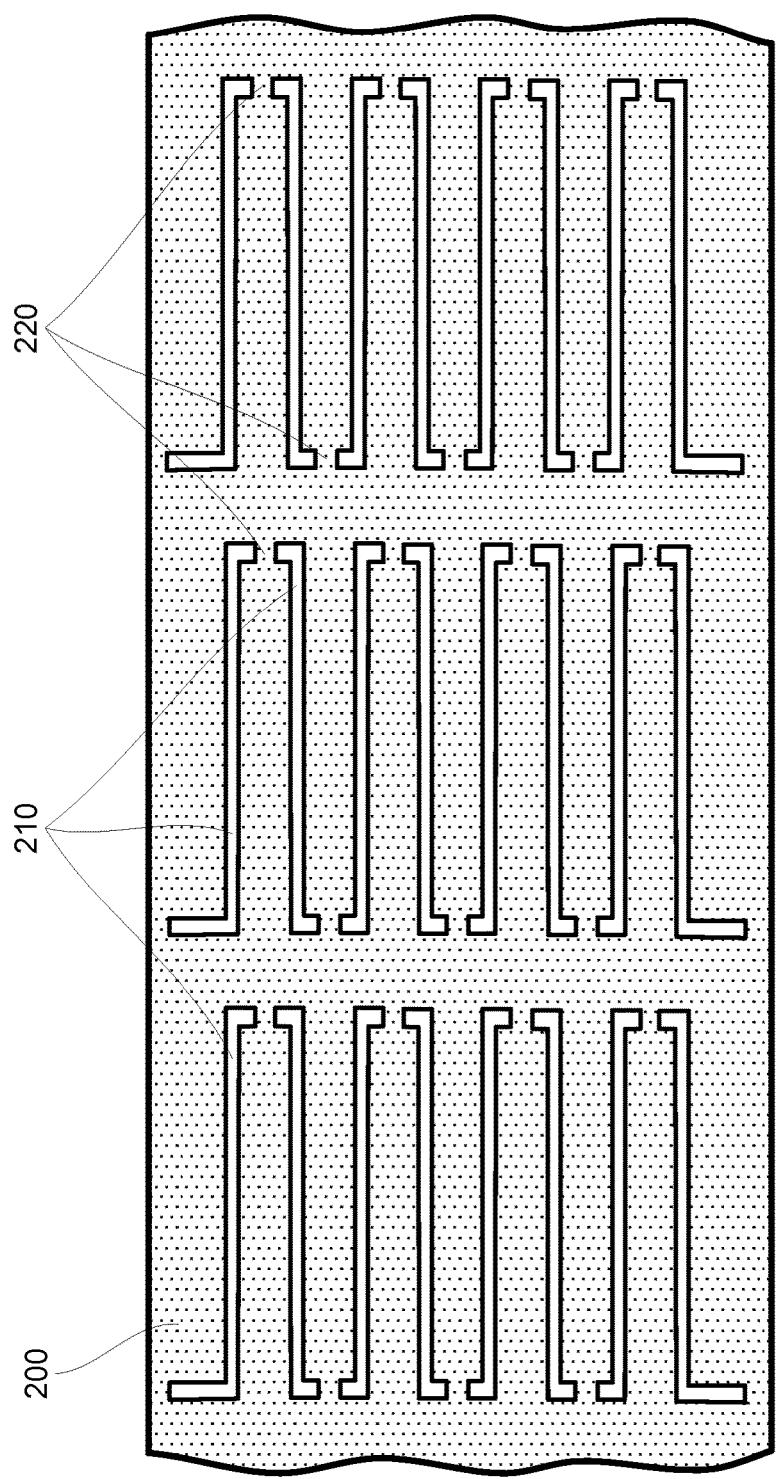
FIGS. 2A-2F are sequential plan view schematic diagrams illustrating examples of the fabrication of an interconnect circuit, in accordance with another embodiment of the invention.

Another embodiment is a method of fabricating an interconnect circuit, as depicted in the sequential plan view diagrams shown in FIGS. 2A-2F. In FIG. 2A, a series of discontinuous openings, or slots 210, is patterned in a starting roll or sheet of conductive foil 200. The starting width of a roll of conductive foil 200 may range from approximately half the width of a rear-contact solar cell to more than twice the width of a rear-contact solar cell. Note that while relatively long and narrow slots 210 are depicted in FIG. 2A, in practice the slots may comprise a wide variety of shapes and/or sizes depending on the pattern of contacts on a rear-contact solar cell. Various methods may be used to form the slots 210, including but not limited to punching, flat bed die cutting, match-metal die cutting, male/female die cutting, rotary die cutting, laser cutting, or combinations thereof. In one embodiment, rotary die cutting may be used to form the slots 210 from a continuous roll of conductive foil 200.

Of the total desired volume of conductive foil to be removed in the fabrication process of the interconnect circuit, in some embodiments approximately 65-99% may be removed during the formation of the slots 210. Near the ends of the slots 210, connecting tabs 220 may optionally be left in place (i.e., not removed during the process of forming the slots) in order to help preserve the mechanical integrity of the conductive foil 200. If the connecting tabs 220 are not left in place, the conductive foil 200 may become flimsy in the vicinity of the slots 210, leading to difficulties in handling the conductive foil 200 during subsequent process steps. In some embodiments, the use of connecting tabs 220 may allow the number of fingers in each set of interdigitated fingers to be increased. For example, a periodicity in the interdigitated fingers of less than about 3 cm (i.e., a finger-to-finger spacing of 1.5 cm or less) may be enabled through the use of the connecting tabs. In other embodiments, the periodicity may be about 2 cm or less. In still other embodiments, the periodicity may be about 1.5 cm or less.

In addition, the mechanical integrity of the conductive foil 200 may be further enhanced by ensuring the slots 210 do not extend all the way to the edges of the conductive foil 200. The presence of an unpatterned edge region in the conductive foil may be particularly useful in embodiments in which the slot openings occupy a large fraction of the area of a rear-contact solar cell, for example when the interconnect circuit is used to connect rear-contact solar cells that have a low number of rear-contacts or have contacts near the cell edges.

Figure 2B:
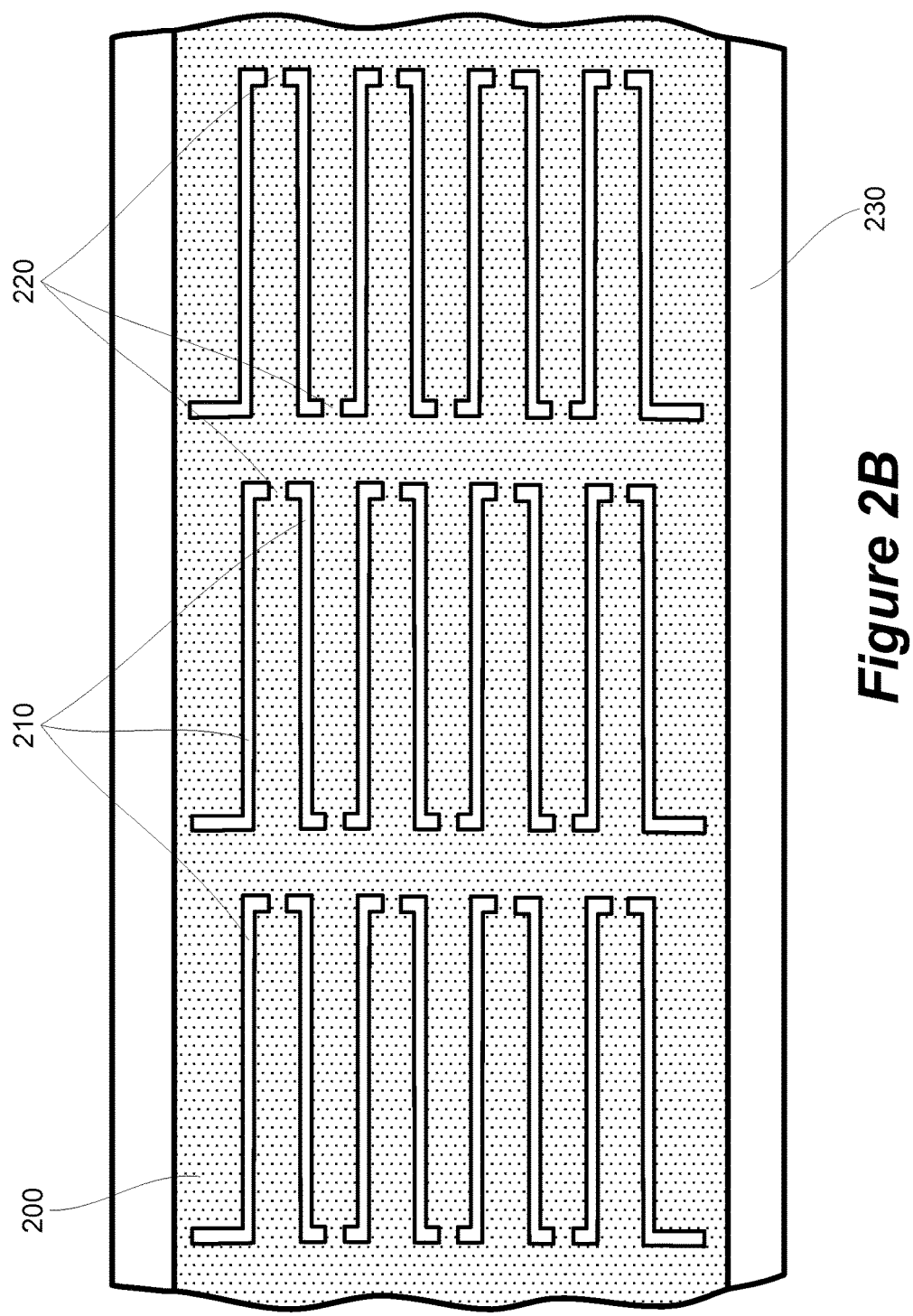

In FIG. 2B, a roll or sheet of insulating layer 230 is laminated to the rear surface of the conductive foil 200. A first adhesive (not shown) may be used to laminate the two layers together. Adhesive types that may be used to laminate the layers include, but are not limited to, hot melt adhesives, pressure sensitive adhesives, B-stage adhesives, thermoset adhesives, thermoplastic adhesives, or cross-linking adhesives. If the first adhesive is applied in liquid form, care should generally be taken not to allow a significant amount of adhesive to bleed through the slots 210 on to the front surface of the conductive foil 200. The starting width of the insulating layer 230 may range from approximately equal to the width of a rear-contact solar cell to more than twice the width of a rear-contact solar cell.

Because the insulating layer 230 is applied after the formation of the slots 210, the insulating layer 230 does not need to act as a cutting or patterning surface for the patterning of the slots 210. This enables a relatively thin insulating layer 230 to be used in the interconnect circuit. In some embodiments, the insulating layer 230 thickness may be about 50 microns or less. In other embodiments, the insulating layer thickness may be about 25 microns or less.

In still other embodiments, the insulating layer thickness may be about 12.5 microns or less.

In some embodiments, a dielectric isolation layer (not shown) may next be applied to the front surface of the conductive foil. Openings may be formed in the dielectric isolation layer to allow electrical connections to be made between the conductive foil 200 and the positive and negative polarity contacts of the rear-contact solar cell.

In the upside-down configuration, the insulating layer 230 is laminated to the front surface of the conductive foil 200 rather than the rear surface. In this configuration the insulating layer 230 may provide some degree of electrical isolation between the conductive foil 200 and the rear-contact solar cells, thereby potentially eliminating the need for the dielectric isolation layer. Prior to lamination of the insulating layer 230 to the conductive foil 200, the insulating layer 230 may be patterned with openings (not shown) that at least partially match the pattern of contacts of the rear-contact solar cells. Techniques that may be used to create openings in the insulating layer 230 include, but are not limited to, punching, flat bed die cutting, match-metal die cutting, male/female die cutting, rotary die cutting, laser cutting, or combinations thereof. In one embodiment, rotary die cutting may be used to form the openings in the insulating layer 230 due to its high throughput and low cost. Alternatively, in some embodiments a continuous sheet of the insulating layer 230 may be laminated to the conductive foil 200, followed by the formation of openings in the insulating layer 230 using a removal technique such as etching or laser ablation.

Figure 2C:
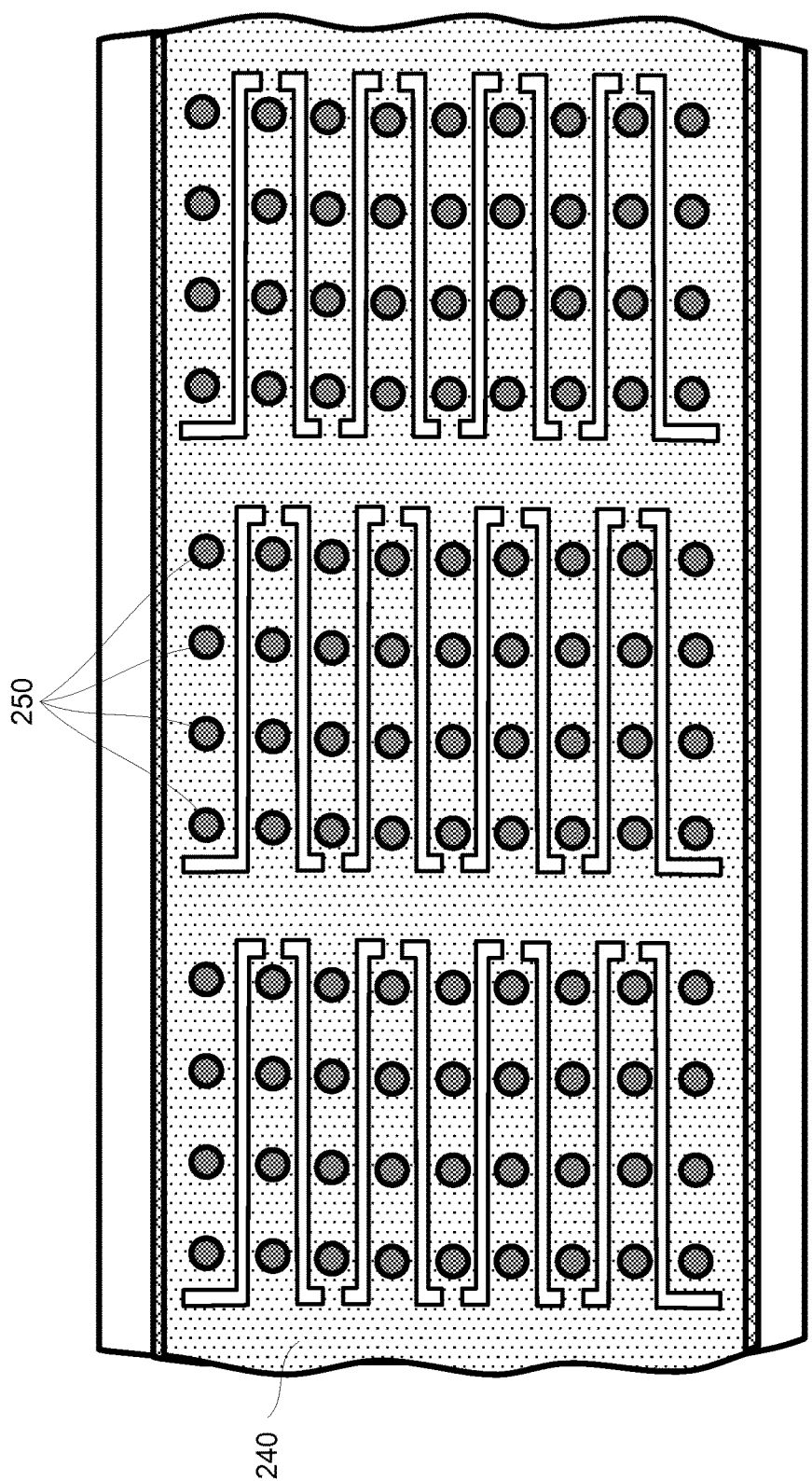

Next, returning to the base configuration shown in FIG. 2C, a second adhesive layer 240 may optionally be applied to the front surface of the conductive foil. In other embodiments (not shown), the second adhesive layer 240 may first be applied to the dielectric isolation layer, to the rear-contact solar cells, or, in the case of the upside-down configuration, to the front surface of the insulating layer (e.g., before or after the insulating layer has been applied to the conductive foil and/or patterned with openings). The second adhesive layer 240 may be patterned with openings 250 corresponding to the locations of positive and negative polarity contacts on the rear-contact solar cells. Furthermore, although the second adhesive layer 240 is depicted as being applied before the subsequent removal steps shown in FIGS. 2D-2E, in other embodiments the second adhesive layer 240 may be applied after these and/or other steps in the process.

In some embodiments the second adhesive layer 240 may be applied in liquid form from solution or a molten state. Techniques including, but not limited to, screen printing, rotary screen printing, flexo printing, gravure coating, slot coating, inkjet printing, or spray coating may be used to apply the second adhesive layer 240 in regions where the openings 250 are not present. Alternatively, if the second adhesive layer 240 is provided in sheet or roll form, the layer may optionally be patterned with openings before it is applied to the other layers. Techniques that may be used to create openings in the second adhesive layer 240 include, but are not limited to, punching, flat bed die cutting, match-metal die cutting, male/female die cutting, rotary die cutting, laser cutting, or combinations thereof. In still other embodiments, the second adhesive layer 240 may be laminated to either the conductive foil, dielectric isolation layer, or the rear-contact solar cells as a continuous sheet, followed by the formation of openings in the second adhesive layer 240 using a removal technique such as etching or laser ablation.

In the upside-down configuration, in some embodiments the insulating layer is patterned with openings prior to lamination to the conductive foil, as described above. In these embodiments, the second adhesive layer 240 may optionally be applied to the front surface of the insulating layer (e.g., by laminating a sheet or forming a coating) prior to the formation of openings in the insulating layer. Openings may then be patterned in both layers simultaneously using a single cutting or removal step, thereby potentially simplifying the overall fabrication process of the interconnect circuit. The use of the insulating layer as a supportive layer for the second adhesive layer 240 during patterning may help improve the dimensional stability of the second adhesive layer 240. This approach may be particularly beneficial when the second adhesive layer 240 is thin (e.g., less than 100 microns thick), since the tendency of unsupported adhesive materials to warp or deform during (or subsequent to) patterning tends to increase substantially as the layer thickness decreases. Once the second adhesive layer 240 and the insulating layer have been laminated together and patterned with openings, the rear surface of the insulating layer may be laminated to the conductive foil.

Figure 2D:
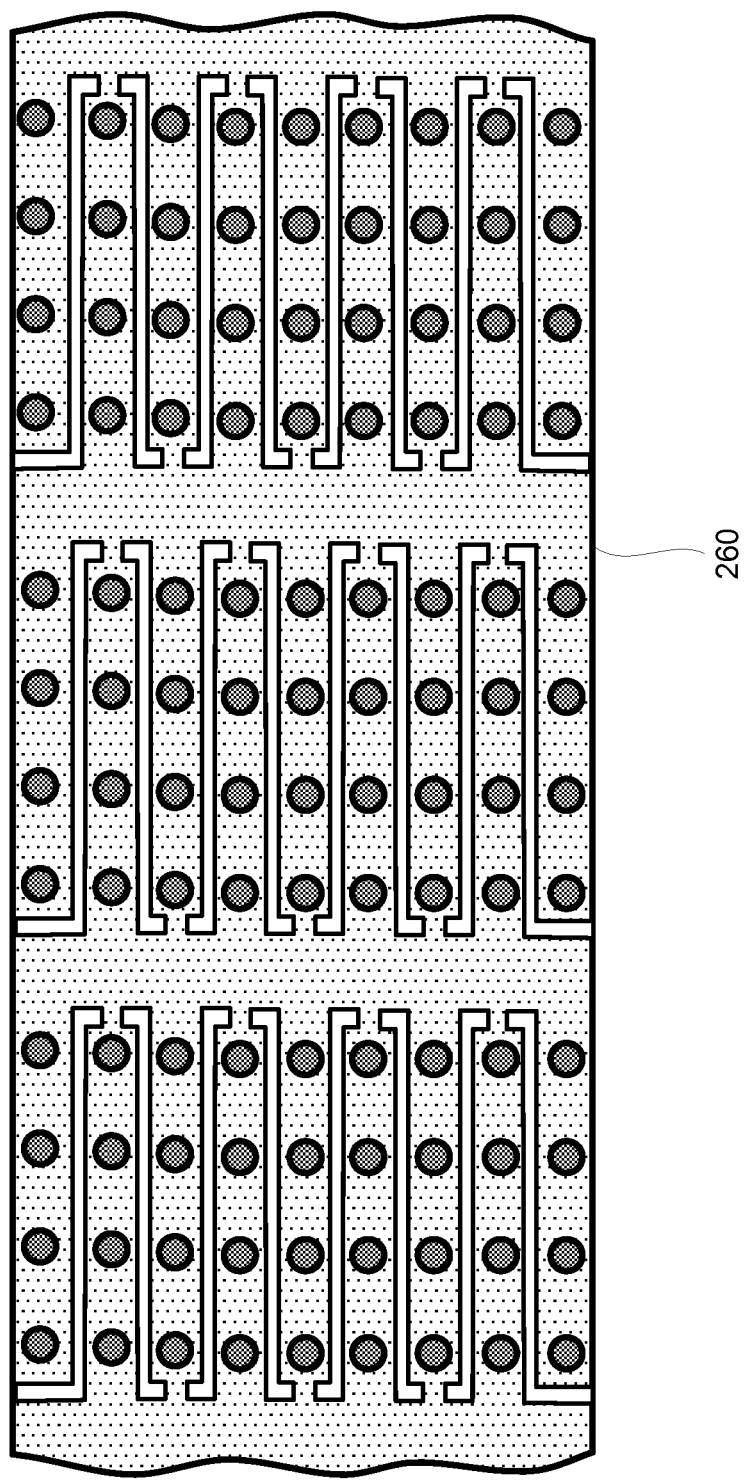

Returning to the base configuration shown in FIG. 2D, the edges of the laminate comprising the patterned conductive foil, first adhesive, insulating layer, and optional second adhesive layer are removed, for example using a cutting or slitting process, to form slit edges 260. During the slitting process, the insulating layer provides mechanical support to the conductive foil and, along with the optional connecting tabs, helps prevent the conductive foil from becoming mechanically decoupled as the edges are removed. Following the removal step, the final width of the laminate may range from approximately half the width of a rear-contact solar cell to approximately 1.5 times the width of a rear-contact solar cell. In one embodiment, the final width of the laminate is approximately the same as the width of a rear-contact solar cell.

Figure 2E:
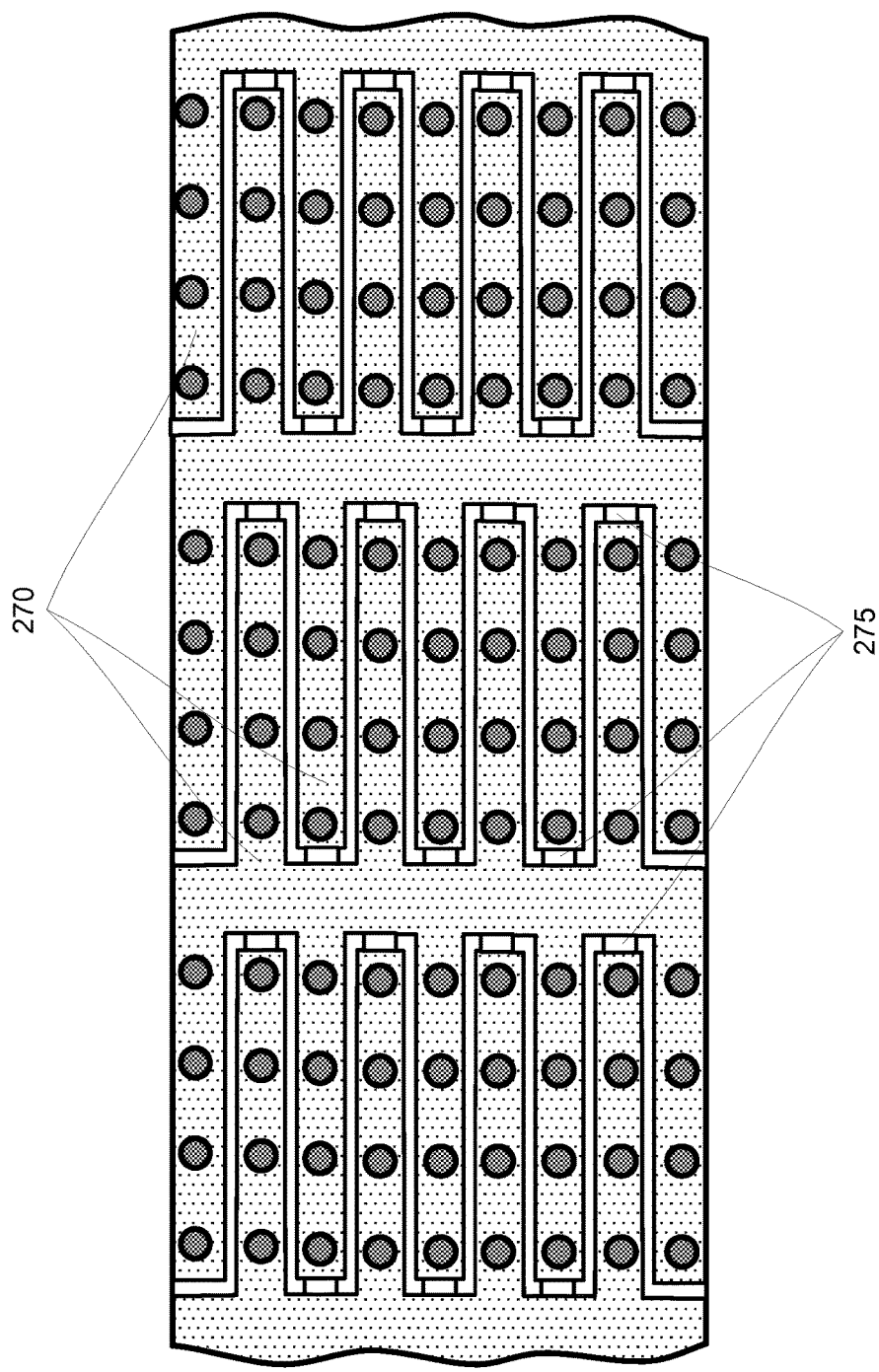

Next, the connecting tabs are removed from the conducting foil to form electrically isolated sets of interdigitated fingers 270, as shown in FIG. 2E. As in the cutting/slitting step shown in FIG. 2D, the fact that the conductive foil is supported by the insulating layer ensures that the sets of interdigitated fingers 270 will not become mechanically decoupled during the removal of the connecting tabs. This significantly simplifies the handling of the interdigitated fingers 270 and helps maintain their alignment during subsequent process steps. Additionally, since in some embodiments the insulating layer is incorporated as a separate component from the protective backsheet in the rear-contact PV module, it is possible to form openings in the insulating layer during removal of the connecting tabs without compromising the environmental resilience of the module. This stands in contrast to the insulating layers most commonly found in commercially available protective backsheets, which are generally made continuous to maximize electrical isolation. Examples of openings formed in the insulating layer during the removal of the connecting tabs are shown at locations 275 in FIG. 2E.

Various methods may be used to remove the connecting tabs, including but not limited to punching, flat bed die cutting, match-metal die cutting, male/female die cutting, rotary die cutting, laser ablation, applying a large voltage, or combinations thereof. In some embodiments, a vision alignment system may be used to ensure that the cutting apparatus precisely removes the connecting tabs. In one embodiment, rotary die cutting with a vision alignment system may be used to remove the connecting tabs. The die cutting pattern used to remove the connecting tabs may be made slightly larger than the size of the tab itself to make sure the connecting tabs are completely removed by the cutting apparatus.

Alternatively, in some embodiments the connecting tabs may be removed without forming openings in the insulating layer. For example, if the first adhesive that bonds the conductive foil to the insulating layer is selectively applied so that it is not present in regions where the connecting tabs are immediately adjacent to the insulating layer, the connecting tabs will not be directly bonded to the insulating layer and may be removed using a partial cutting technique such as kiss cutting or laser cutting. In some embodiments, laser cutting combined with vacuum removal may be used to remove the connecting tabs.

In some embodiments, a surface finish (not shown) may be coated or applied to the exposed upper surface of the conductive foil to help prevent long-term oxidation and/or corrosion. The surface finish material may be plated, sputtered, cold welded, or applied via other means. If the surface finish is plated, in some embodiments the surface finish may be applied after the application of the second adhesive layer, so that the total volume of plated material may be reduced. This can help reduce the production cost of the interconnect circuit. Furthermore, in embodiments in which it is desirable to apply the surface finish using electroplating, the surface finish may be applied prior to removal of the connecting tabs, so that the electrical continuity of the conductive foil may be maintained during the plating process.

Figure 2F:
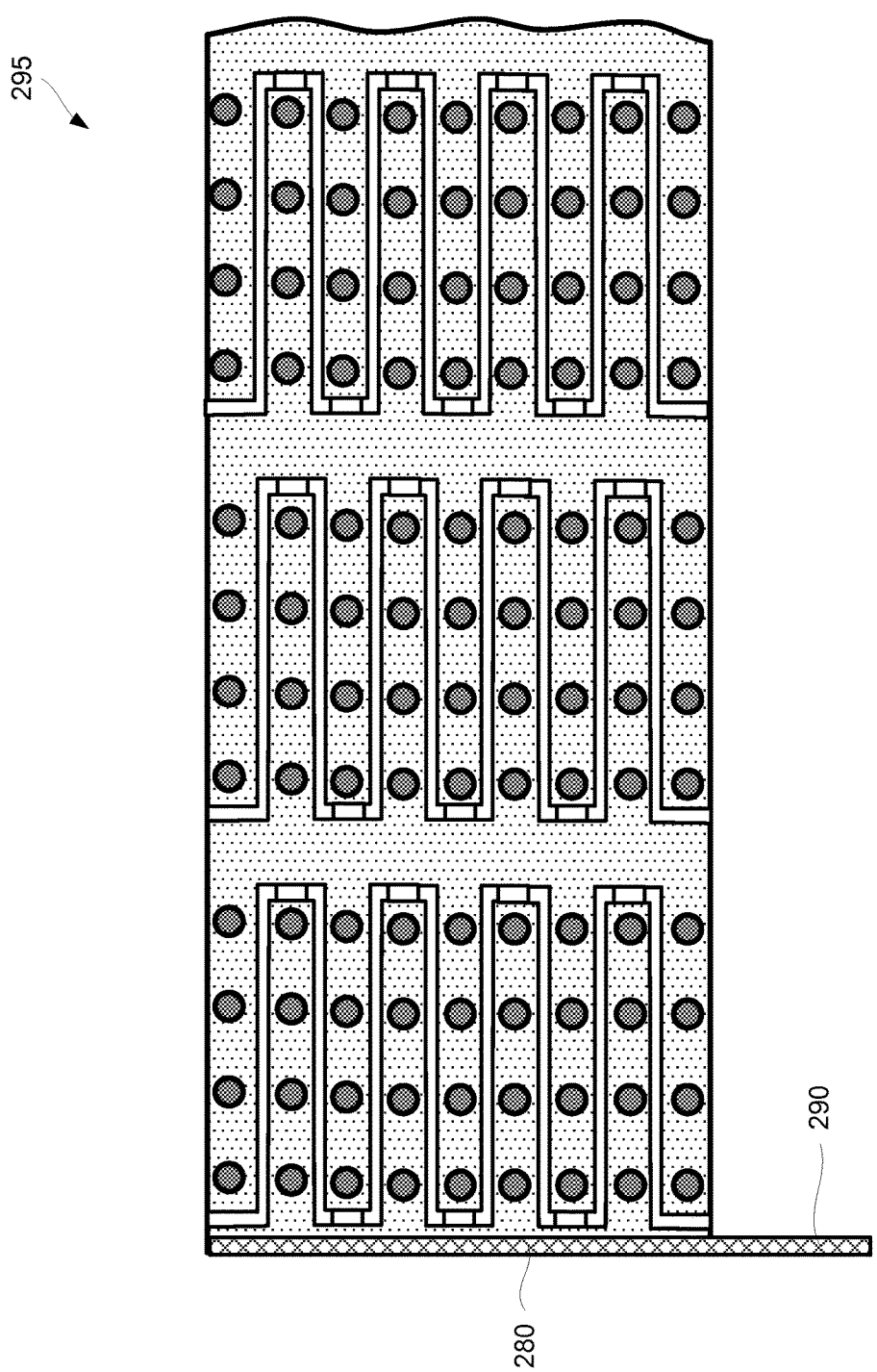

If the conductive foil and insulating layer are supplied in roll form, the rolls may be cut into discrete sheets to form one or more interconnect circuits 295 as shown in FIG. 2F. A precise edge cut 280 may be made in order to ensure that both interconnect circuits 295 adjacent to (i.e., on both the left and right sides of) the edge cut 280 may be utilized in a rear-contact PV module. Once cut, in some embodiments the length of the interconnect circuit 295 may be approximately the same as the length of a typical series-connected string of rear-contact solar cells. For example, if the length of each of the rear-contact solar cells is approximately 156 mm and the series-connected string connects 10 cells, the length of the interconnect circuit 295 may be approximately 1560-1590 mm (a small tolerance may be built in to the interconnect circuit repeat length to allow for a 1-2 mm space between each cell).

Once the rolls have been cut into discrete interconnect circuits 295, connecting busbars 290 may optionally be attached to the ends. Techniques which may be used to attach the connecting busbars 290 to the interconnect circuits 295 include, but are not limited to, soldering, brazing, laser welding, or bonding with conductive adhesives such as PSAs or epoxies. In the base configuration depicted in FIGS. 2A-2F, the connecting busbars 290 may be attached to the top surface of the conductive foil, or, in another embodiment, may be connected to the bottom surface of the conductive foil through the insulating layer using laser welding, ultrasonic soldering, or some other bonding technique. In the upside-down configuration, connecting busbars 290 may be optionally attached to the exposed rear surface of the conducting foil; the completed interconnect circuit 295 may then be attached to a protective backsheet (e.g., with the connecting busbars 290 disposed between the bottom surface of the conductive foil and the top surface of the protective backsheet).

Once interconnect circuits 295 have been fabricated, at least two different approaches may be used to incorporate the interconnect circuits into a rear-contact PV module. In a first embodiment, one or more interconnect circuits 295 are laminated to a protective backsheet in order to form a conductive backsheet (as depicted in FIG. 1C). The spacing between adjacent circuits may be precisely controlled during lamination to prevent adjacent interconnect circuits from contacting each other, which could potentially lead to an electrical short. The connecting busbars 290 may be interconnected to form a series connection between successive interconnect circuits 295. Once the interconnect circuits 295, busbars 290, and any external connectors have been incorporated into the conductive backsheet, rear-contact solar cells may then be connected to the conductive backsheet (by dispensing conductive adhesive dots and using pick-and-place robots to place the rear-contact solar cells, for example) and processed to form a rear-contact PV module.

Figure 3:
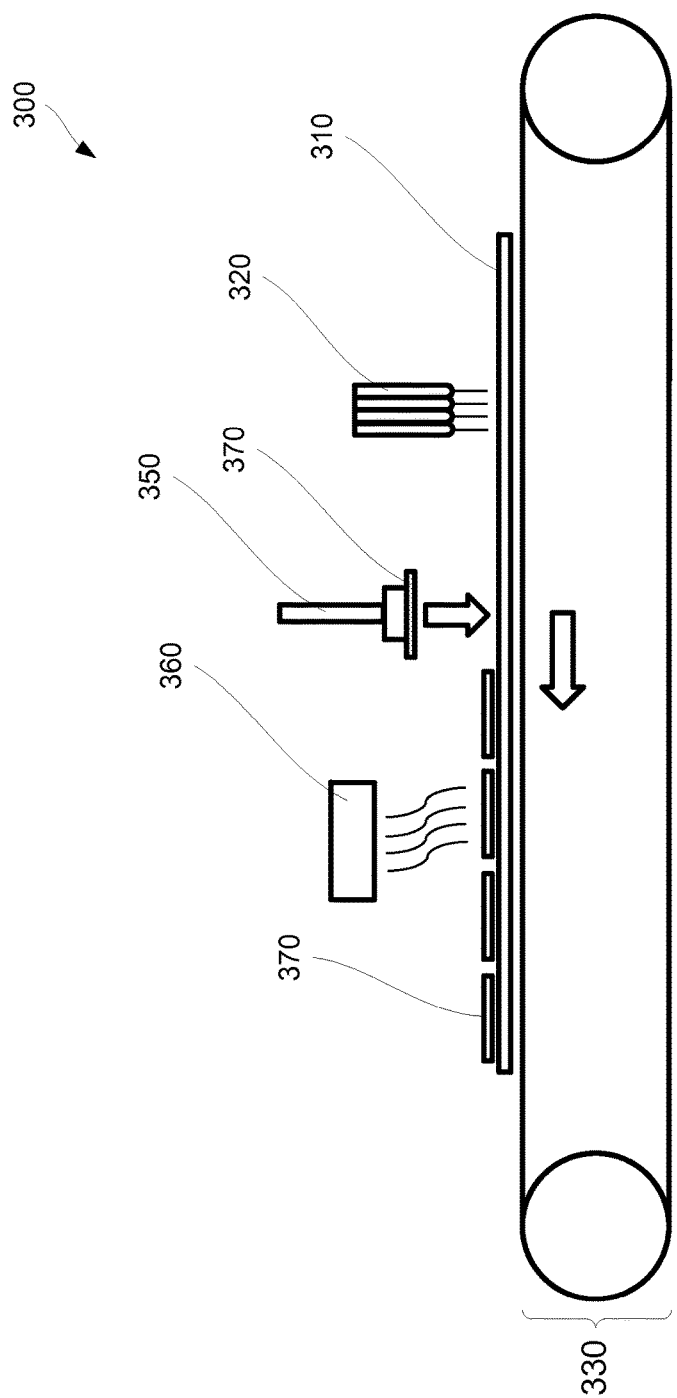
FIG. 3 is a schematic diagram illustrating an example of an apparatus that may be used to connect rear-contact solar cells to an interconnect circuit, in accordance with another embodiment of the invention.

Alternatively, one or more rear-contact solar cells may be attached to an interconnect circuit before the interconnect circuit is attached to a protective backsheet. FIG. 3 shows an example of a cell interconnect apparatus 300 that may be used to successively apply electrical connection materials and rear-contact solar cells 370 to interconnect circuits 310. A dispense tool 320 may first be used to deposit electrical connection materials such as ECAs or solder pastes on the exposed contact pads of a portion of the interconnect circuit 310. A conveyor 330 then moves the interconnect circuit 310 forward in increments to the pick-and-place robot 350, which places rear-contact solar cells 370 on the interconnect circuit 310. The pick-and-place robot 350 may be equipped with a vision alignment system to improve the placement accuracy of the rear-contact solar cells 370. The conveyor next carries the interconnect circuit 310 forward to an optional heat zone 360. In cases in which the insulating adhesive material and/or electrical interconnection materials are not sufficiently tacky at room temperature, the heat zone 360 may be used to activate the adhesives (either insulating, conductive, or a combination thereof) to form a bond with the rear-contact solar cells 370. In some embodiments, pressure may be applied to the interconnect circuit 310 and the rear-contact solar cells 370 to provide more intimate contact during heating. Once fabricated, in some embodiments the interconnected sub-assembly may then be placed face down on an encapsulant-covered front glass cover sheet (not shown) for the attachment of busbars followed by lamination to a backsheet.

Figure 4A:
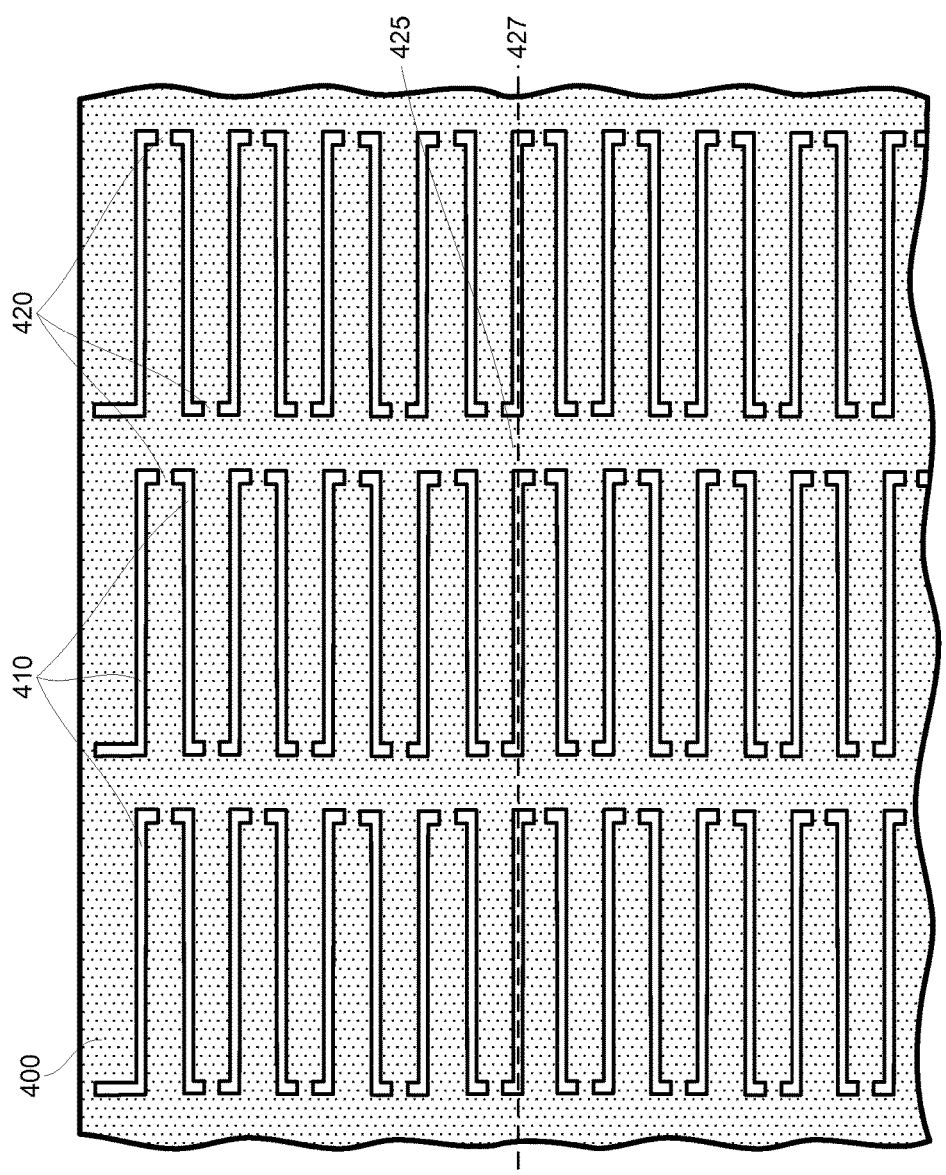
FIGS. 4A-4F are sequential plan view schematic diagrams illustrating examples of the fabrication of a two-dimensional interconnect circuit, in accordance with another embodiment of the invention.

The methods and techniques shown in FIGS. 2A-2F may be extended to the fabrication of large-width interconnect circuits that are capable of connecting two-dimensional arrays of rear-contact solar cells. FIGS. 4A-4F show an example of a process that may be used to make a two-dimensional interconnect circuit. In FIG. 4A, a series of discontinuous openings, or slots 410, are cut in a starting roll or sheet of conductive foil 400. The slots 410 are similar to those shown in FIG. 2A except that additional slots may be cut in regions that will ultimately occupy the space between series-connected strings of rear-contact solar cells. These slots are shown along line 427 in FIG. 4A. Note that while relatively long and narrow slots 410 are depicted in FIG. 4A, in practice the slots may comprise a wide variety of shapes and/or sizes depending on the pattern of contacts on a rear-contact solar cell. Techniques for forming the slots include, but are not limited to, punching, flat bed die cutting, match-metal die cutting, male/female die cutting, rotary die cutting, laser cutting, or combinations thereof. In one embodiment, rotary die cutting may be used to form the slots 410 from a continuous roll of conductive foil 400.

Of the total desired volume of conductive foil to be removed in the fabrication process, approximately 65-99% may be removed during the formation of the slots 410.

Connecting tabs 420 may be left in place (i.e., not removed during the process of forming the slots) to help preserve the mechanical integrity of the conductive foil 400. As in other embodiments, the use of connecting tabs 420 may allow the number of fingers in each set of interdigitated fingers to be increased. For example, a periodicity in the interdigitated fingers of less than about 3 cm (i.e., a finger-to-finger spacing of 1.5 cm or less) may be enabled through the use of the connecting tabs. In other embodiments, the periodicity may be about 2 cm or less. In still other embodiments, the periodicity may be about 1.5 cm or less. In addition, inter-string connecting tabs 425 may be left in place in addition to connecting tabs 420 to further preserve the mechanical integrity of the conductive foil 400.

Figure 4B:
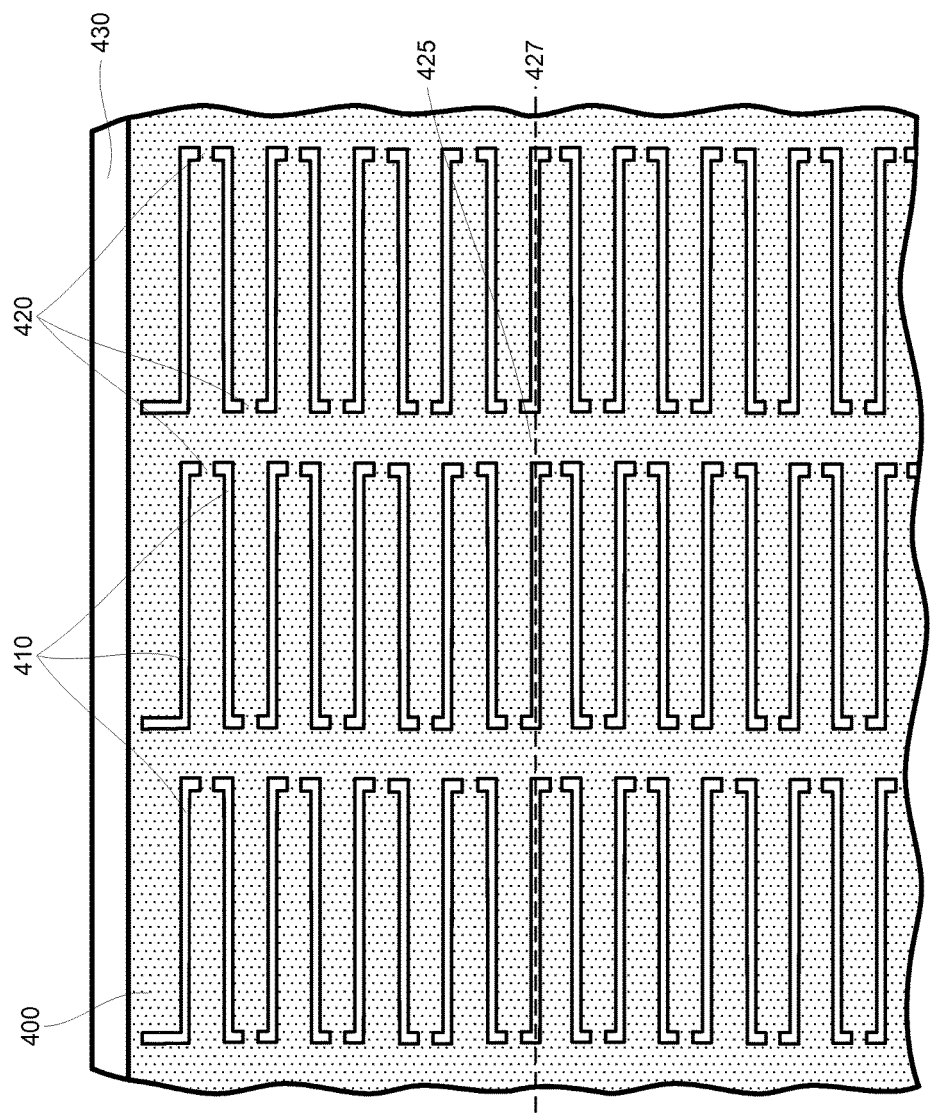

In FIG. 4B, a roll or sheet of insulating layer 430 is laminated to the rear surface of the patterned conductive foil 400. A first adhesive (not shown) may be used to laminate the two layers together. Adhesive types that may be used to laminate the layers include, but are not limited to, hot melt adhesives, pressure sensitive adhesives, B-stage adhesives, thermoset adhesives, thermoplastic adhesives, or cross-linking adhesives. If the first adhesive is applied in liquid form, care should generally be taken not to allow a significant amount of adhesive to bleed through the slots 410 on to the front surface of the conductive foil 400.

Because the insulating layer 430 is applied after the formation of the slots 410, the insulating layer 430 does not need to act as a cutting or patterning surface for the patterning of the slots 410. This enables a relatively thin insulating layer 430 to be used in the two-dimensional interconnect circuit. In some embodiments, the insulating layer 430 thickness may be about 50 microns or less. In other embodiments, the insulating layer thickness may be about 25 microns or less. In still other embodiments, the insulating layer thickness may be about 12.5 microns or less.

In some embodiments, a dielectric isolation layer (not shown) may next be applied to the front surface of the conductive foil. Openings may be formed in the dielectric isolation layer to allow electrical connections to be made between the conductive foil 400 and the positive and negative polarity contacts of the rear-contact solar cell.

As described previously, in the upside-down configuration the insulating layer 430 is laminated to the front surface of the conductive foil 400 rather than the rear surface. In this configuration the insulating layer 430 may provide some degree of electrical isolation between the conductive foil 400 and the rear-contact solar cells, thereby potentially eliminating the need for the dielectric isolation layer. Prior to lamination of the insulating layer 430 to the conductive foil 400, the insulating layer 430 may be patterned with openings (not shown) that at least partially match the pattern of contacts of the rear-contact solar cells. Techniques that may be used to create openings in the insulating layer 430 include, but are not limited to, punching, flat bed die cutting, match-metal die cutting, male/female die cutting, rotary die cutting, laser cutting, or combinations thereof. In one embodiment, rotary die cutting may be used to form the openings in the insulating layer 430 due to its high throughput and low cost. Alternatively, in some embodiments a continuous sheet of the insulating layer 430 may be laminated to the conductive foil 400, followed by the formation of openings in the insulating layer 430 using a removal technique such as etching or laser ablation.

Figure 4C:
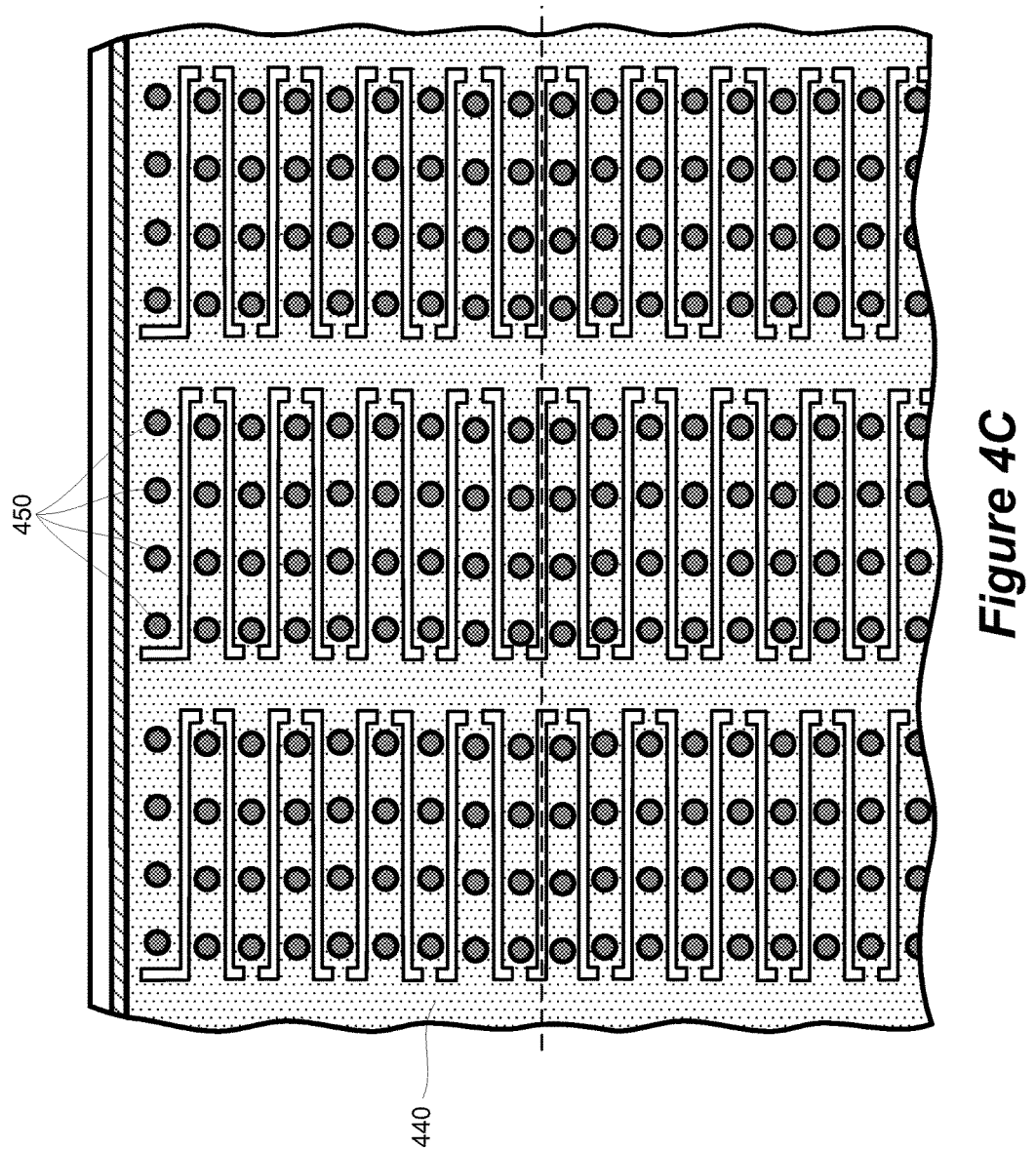

Next, returning to the base configuration shown in FIG. 4C, a second adhesive layer 440 may optionally be applied to the front surface of the patterned conductive foil. In other embodiments (not shown), the second adhesive layer 440 may first be applied to the dielectric isolation layer, to the rear-contact solar cells, or, in the case of the upside-down configuration, to the front surface of the insulating layer (e.g., before or after the insulating layer has been applied to the conductive foil and/or patterned with openings). The second adhesive layer 440 may be patterned with openings 450 corresponding to the locations of positive and negative polarity contacts on the rear-contact solar cells. Furthermore, although the second adhesive layer 440 is depicted as being applied before the subsequent and removal steps shown in FIGS. 4D-4E, in other embodiments the second adhesive layer 440 may be applied after these and/or other steps in the process.

In some embodiments the second adhesive layer 440 may be applied in liquid form from solution or the melt. Techniques including, but not limited to, screen printing, rotary screen printing, flexo printing, gravure coating, slot coating, inkjet printing, or spray coating may be used to apply the second adhesive layer 440 in regions where the openings 450 are not present. Alternatively, if the second adhesive layer 440 is provided in sheet or roll form, the layer may optionally be patterned with openings before it is applied to the other layers. Techniques that may be used to create openings in the second adhesive layer 440 include, but are not limited to, punching, flat bed die cutting, match-metal die cutting, male/female die cutting, rotary die cutting, laser cutting, or combinations thereof. In still other embodiments, the second adhesive layer 440 may be laminated to either the conductive foil, dielectric isolation layer, or the rear-contact solar cells as a continuous sheet, followed by the formation of openings in the second adhesive layer 440 using a removal technique such as etching or laser ablation.

In the upside-down configuration, in some embodiments the insulating layer is patterned with openings prior to lamination to the conductive foil, as described above. In these embodiments, the second adhesive layer 440 may optionally be applied to the front surface of the insulating layer (e.g., by laminating a sheet or forming a coating) prior to the formation of openings in the insulating layer. Openings may then be patterned in both layers simultaneously using a single cutting or removal step, thereby potentially simplifying the overall fabrication process of the interconnect circuit. The use of the insulating layer as a supportive layer for the second adhesive layer 440 during patterning may help improve the dimensional stability of the second adhesive layer 440. This approach may be particularly beneficial when the second adhesive layer 440 is thin (e.g., less than 100 microns thick), since the tendency of unsupported adhesive materials to warp or deform during (or subsequent to) patterning tends to increase substantially as the layer thickness decreases. Once the second adhesive layer 440 and the insulating layer have been laminated together and patterned with openings, the rear surface of the insulating layer may be laminated to the conductive foil.

Figure 4D:
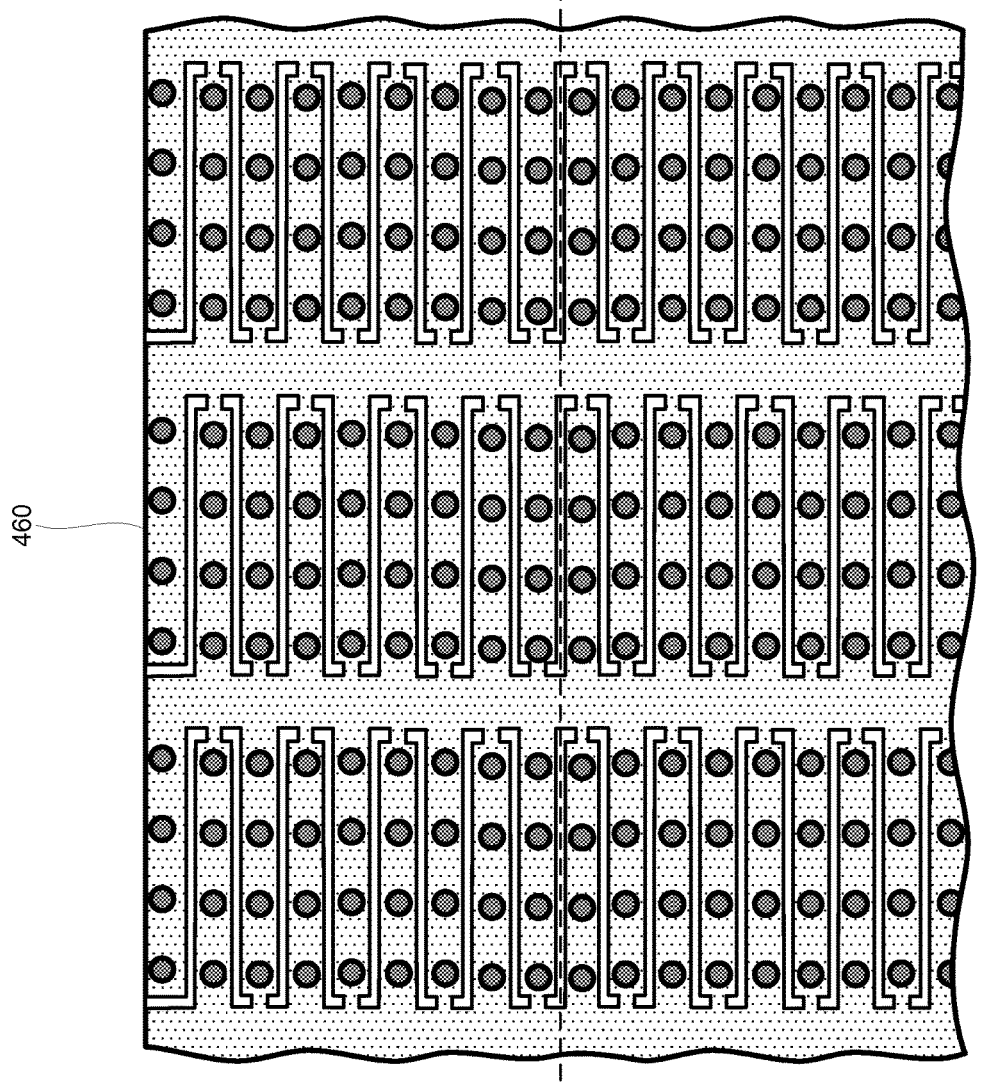

Returning to the base configuration shown in FIG. 4D, the edges of the laminate comprising the patterned conductive foil, first adhesive, insulating layer, and optional second adhesive layer are removed, for example using a cutting or slitting process, to form slit edges 460. During the slitting process, the insulating layer provides mechanical support to the conductive foil and, along with the optional connecting tabs and inter-string connecting tabs, helps prevent the conductive foil from becoming mechanically decoupled as the edges are removed. Whereas the final width of the laminate may be approximately the same as the width of a rear-contact solar cell in an embodiment shown in FIG. 2D, in an embodiment depicted in FIG. 4D the final width may be several times larger than the width of a rear-contact solar cell. For example, if the width of the rear-contact solar cells is 156 mm and there are 6 series-connected strings of rear-contact solar cells in the PV module, the final width of the laminate may be approximately 936-960 mm (a small tolerance may be built in to the final width of the laminate to allow for a 1-2 mm space between each string). In other embodiments, the final width of the laminate may be 0.8 to 1.5 times the width of the rear-contact solar cells multiplied by the number of series-connected strings of rear-contact solar cells in the PV module. In still other embodiments, for example in embodiments in which the availability of 500-1500 mm wide roll-to-roll processing equipment is limited, the final width of the laminate may be within 20% of the combined width of 2, 3, or 4 rear-contact solar cells.

Figure 4E:
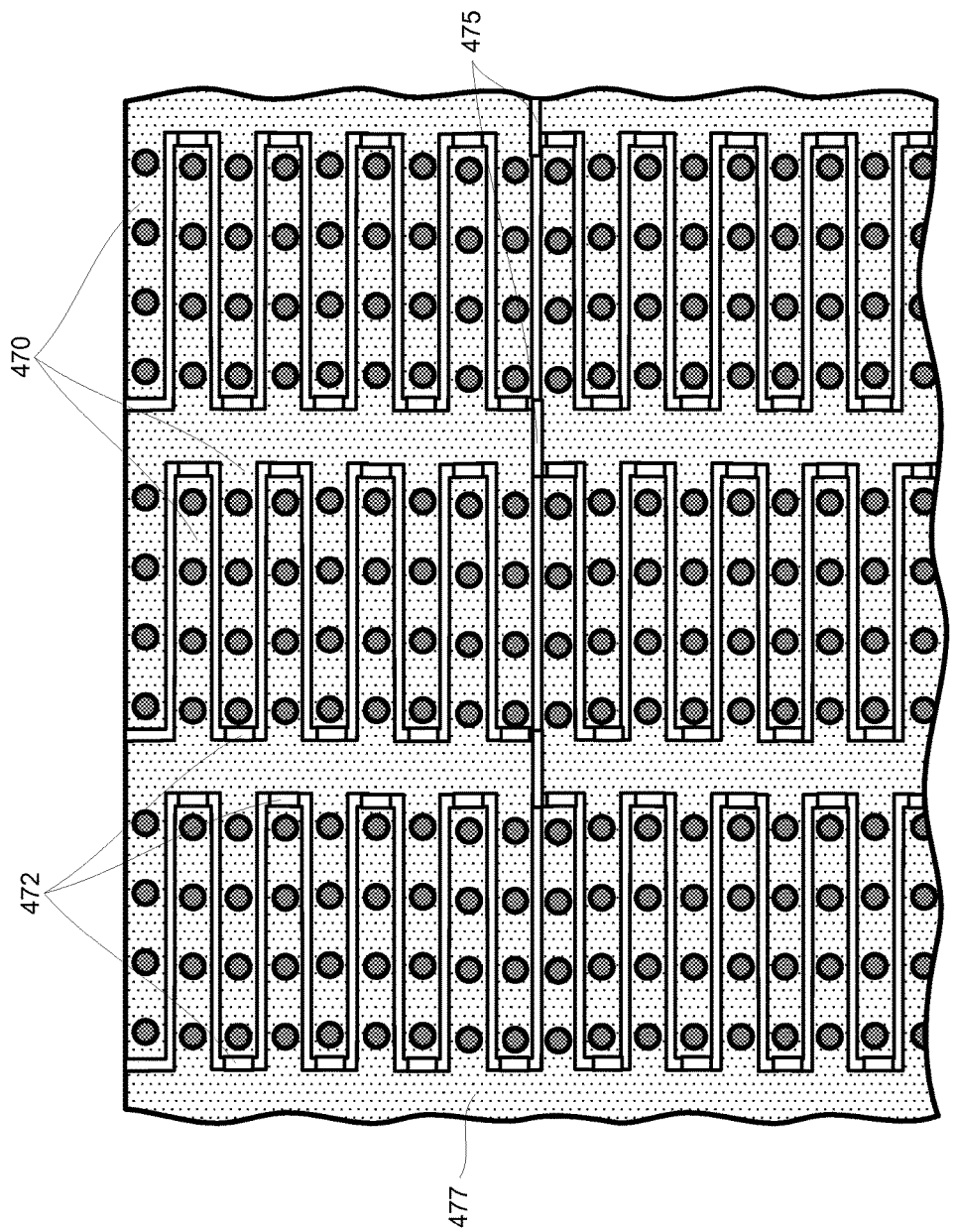

Next, connecting tabs and inter-string connecting tabs are removed to form electrically isolated sets of interdigitated fingers 470 and electrically isolated adjacent strings, as shown in FIG. 4E. As with the cutting/slitting step shown in FIG. 4D, the fact that the conductive foil is supported by the insulating layer ensures that the sets of interdigitated fingers 470 will not become mechanically decoupled during the removal of the connecting tabs and inter-string connecting tabs. This significantly simplifies the handling of the sets interdigitated fingers 470 and helps maintain their alignment during subsequent process steps. Additionally, since in some embodiments the insulating layer is incorporated as a separate component from the protective backsheet in the rear-contact PV module, it is possible to form openings in the insulating layer during removal of the connecting tabs 420 without compromising the environmental resilience of the module. This stands in contrast to the insulating layers most commonly found in commercially available protective backsheets, which are generally made continuous to maximize electrical isolation. Examples of openings formed in the insulating layer during the removal of the connecting tabs and inter-string connecting tabs are shown at locations 472 and 475, respectively, in FIG. 4E.

Various methods may be used to remove the connecting tabs and inter-string connecting tabs, including but not limited to punching, flat bed die cutting, match-metal die cutting, male/female die cutting, rotary die cutting, laser ablation, applying a large voltage, or combinations thereof. In some embodiments, a vision alignment system may be used to make sure the cutting apparatus precisely removes the connecting tabs and inter-string connecting tabs. In one embodiment, rotary die cutting with a vision alignment system may be used to remove the connecting tabs and inter-string connecting tabs. The die cutting pattern used to remove the connecting tabs and inter-string connecting tabs may be made slightly larger than the size of the tab itself to make sure the tabs are completely removed by the cutting apparatus.

Alternatively, in some embodiments the connecting tabs and inter-string connecting tabs may be removed without forming openings in the insulating layer. For example, if the first adhesive that bonds the conductive foil to the insulating layer is selectively applied so that it is not present in regions where the connecting tabs and inter-string connecting tabs are immediately adjacent to the insulating layer, the connecting tabs will not be directly bonded to the insulating layer and may be removed using a partial cutting technique such as kiss cutting or laser cutting. In some embodiments, laser cutting combined with vacuum removal may be used to remove the connecting tabs.

In some embodiments, some inter-string connecting tabs may be left in place (i.e., not removed) in locations where electrical connections between adjacent strings are desired. For example, inter-string connecting tabs may be left at alternating ends of successive series-connected strings in order to electrically connect adjacent strings in series. An example of a remaining inter-string connecting tab is shown at location 477 in FIG. 4E.

Figure 4F:
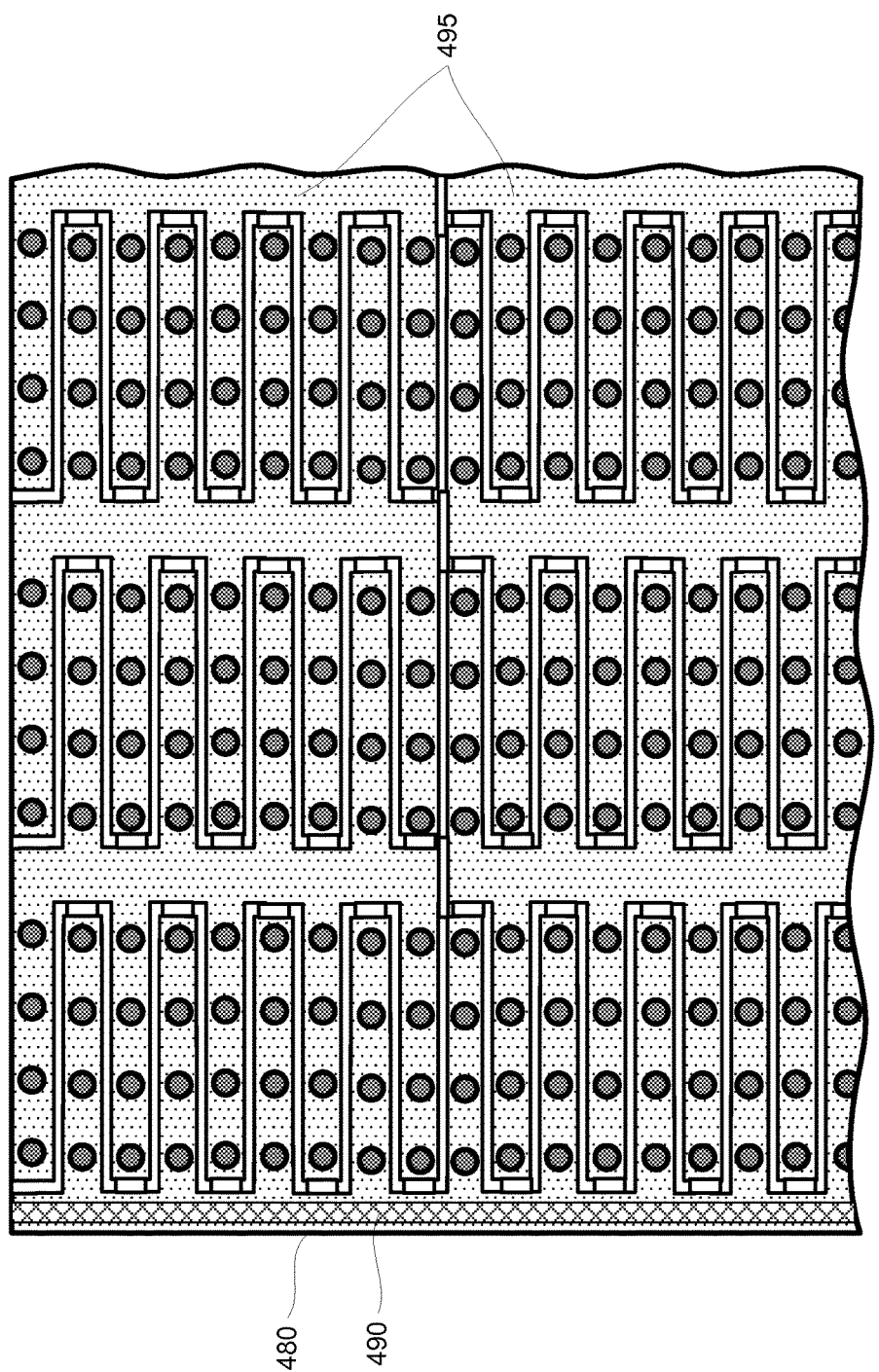

If the conductive foil and insulating layer are supplied in roll form, the rolls may be cut into discrete sheets to form one or more two-dimensional interconnect circuits as shown in FIG. 4F. A precise edge cut 480 may be made in order to ensure that both two-dimensional interconnect circuits adjacent to (i.e., on both the left and right sides of) the edge cut 480 may be utilized in rear-contact PV modules. Once cut, the length of the two-dimensional interconnect circuit may be approximately the same as the length of a typical series-connected string of rear-contact solar cells. For example, if the length of each of the rear-contact solar cells is 156 mm and the circuits are used to interconnect 10 cells, the length of the two-dimensional interconnect circuits may be approximately 1560-1590 mm (a small tolerance may be built in to the interconnect circuit repeat length to allow for a 1-2 mm space between each cell).

Once the rolls have been cut into discrete two-dimensional interconnect circuits, connecting busbars 490 may optionally be attached to alternating ends of adjacent series-connected strings 495. Techniques which may be used to attach the connecting busbars 490 to the strings 495 include, but are not limited to, soldering, brazing, laser welding, or bonding with conductive adhesives such as PSAs or epoxies. In the base configuration depicted in FIGS. 4A-4F, the connecting busbars 490 may be attached to the top surface of the conductive foil, or, in another embodiment, may be connected to the bottom surface of the conductive foil through the insulating layer using laser welding, ultrasonic soldering, or some other bonding technique. In the upside-down configuration, connecting busbars 490 may be attached to the exposed rear surface of the conducting foil 400; the completed two-dimensional interconnect circuit may then be attached to a protective backsheet (e.g., with the connecting busbars 290 disposed between the bottom surface of the conductive foil 200 and the top surface of the protective backsheet).

As in prior embodiments, at various stages of the process a surface finish may be applied to the exposed surfaces of the conductive foil 400 to help prevent long-term oxidation and/or corrosion. In addition, the completed two-dimensional interconnect circuits may first be laminated to a protective backsheet, or may first be attached to rear-contact solar cells, to complete the fabrication of a rear-contact PV module (not shown).

A potential advantage to the embodiments depicted in FIGS. 2A-2F and FIGS. 4A-4F is that interconnect circuits, two-dimensional interconnect circuits, and conductive backsheets comprising interconnect circuits may be fabricated using low-cost, high-throughput process techniques such as roll-to-roll lamination and rotary die cutting. In their simplest form, the embodiments described in FIGS. 2A-2F and 4A-4F comprise a series of three steps: A first removal step removes the majority of the undesired regions of a starting conductive foil sheet but leaves enough of the conductive foil material to preserve its mechanical integrity; the conductive foil is then attached to an insulating carrier substrate that provides mechanical support, followed by the removal of the remaining undesired regions of conductive foil. Through this approach it is possible to fabricate interconnect circuits comprising mechanically-supported, electrically-isolated regions of conductive foil using low-cost process techniques. The interconnect circuits may then be used to interconnect rear-contact solar cells.

Whereas some of the fabrication methods depicted in FIGS. 2A-2F and FIGS. 4A-4F involve the use of connecting tabs to help preserve the mechanical integrity of the conductive foil, in other embodiments it is possible to make interconnect circuits without the use of connecting tabs. An example of such a process flow is shown in sequential plan view in FIGS. 5A-5E. First, in FIG. 5A, a bottom surface of a roll or sheet of conductive foil 500 is laminated to a temporary carrier substrate 510. A temporary or low-tack adhesive (not shown) is preferably used to attach the conductive foil 500 to the carrier substrate 510. The temporary adhesive, which may optionally be unpatterned, should ideally be capable of holding the conductive foil 500 in place without leaving a residue on the conductive foil 500 when the foil 500 is later peeled away from the carrier substrate 510, as described below.

Figure 5B:
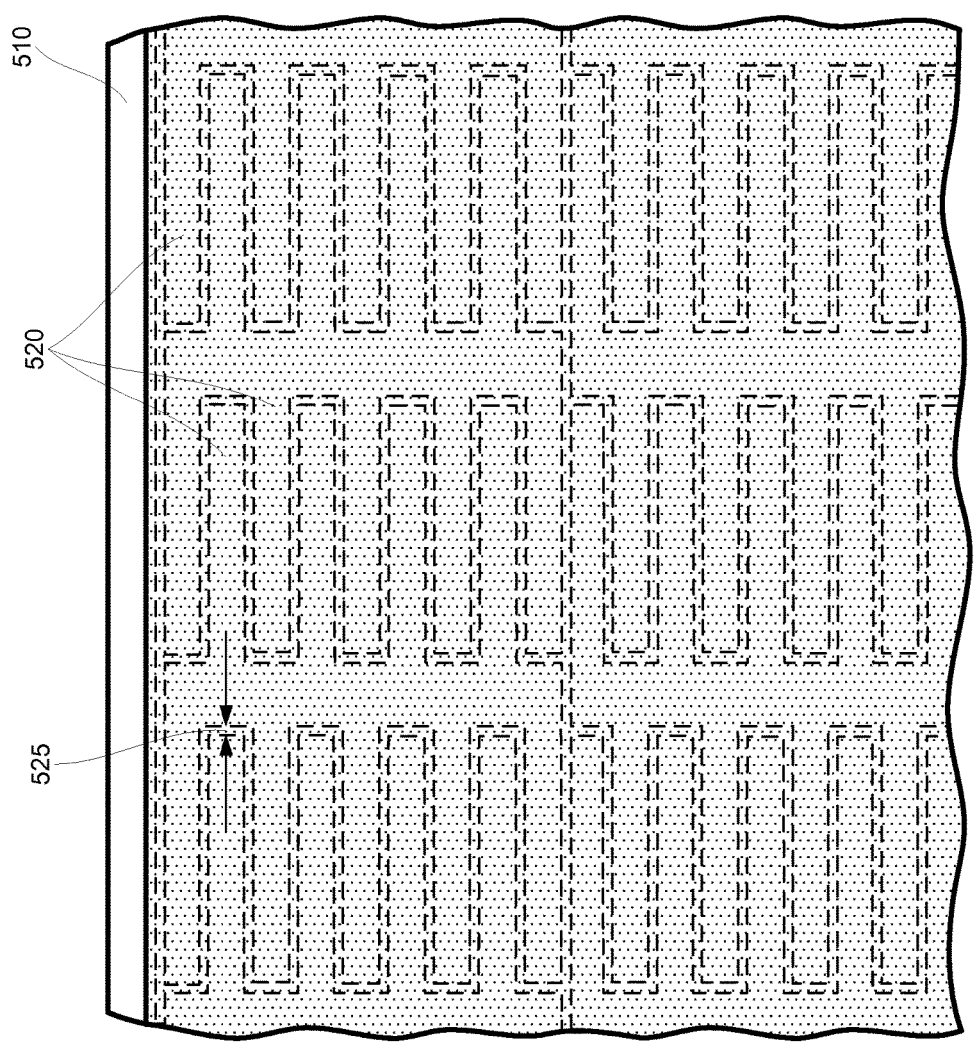

Next, in FIG. 5B, a pattern of interdigitated fingers 520 is kiss (i.e., partially) cut into the conductive foil/carrier substrate laminate. The locations of the kiss cut are denoted with dashed lines in FIG. 5B. The kiss cut is initiated from the conductive foil side of the layer stack and should generally be deep enough that the conductive foil is fully severed by the cutting apparatus, but not so deep that the carrier substrate is also fully severed. Techniques including, but not limited to, flat bed kiss cutting, rotary kiss cutting, water jet kiss cutting, or laser kiss cutting may be used to kiss cut the layer stack. In one embodiment, rotary kiss cutting may be used due to its high speed and low cost.

In order to help ensure that the carrier substrate is not completely cut through during the kiss cutting process, it is preferable for the thickness of the carrier substrate 510 to be greater than the depth precision of the kiss cutting apparatus. For example, in embodiments in which rotary kiss cutting is used to pattern the conductive foil, a thickness of the carrier substrate 510 of around 50 to 150 microns may provide a sufficient cutting tolerance. In another embodiment, a thickness of around 50 to 100 microns may be sufficient. Furthermore, it is beneficial for the carrier substrate 510 to comprise a material that is durable enough to provide mechanical support to the conductive foil during the kiss cutting process, yet not so stiff or rigid that it is difficult to cut precisely. The carrier substrate may comprise materials including, but not limited to, polyethylene, polyimide, paper, PEN, or PET that have been coated with a low-tack adhesive. In one embodiment, the carrier substrate 510 comprises PET.

In contrast to other embodiments in which connecting tabs are left in place when the conductive foil is patterned, in the embodiment depicted in FIG. 5B complete sets of interdigitated fingers may be patterned in a single kiss cutting step. This is due to the mechanical support provided by the carrier substrate 510 during the cutting process. The kiss cutting pattern may include gaps 525 between adjacent sets of interdigitated fingers 520. This helps ensure that adjacent interdigitated fingers 520 do not electrically short together in the final interconnect circuit, and provides an alignment tolerance for subsequent process steps. In some embodiments, the size of the gaps 525 may be approximately 2 mm or larger. In other embodiments, the gaps 525 may be approximately 1 mm or larger.

Figure 5C:
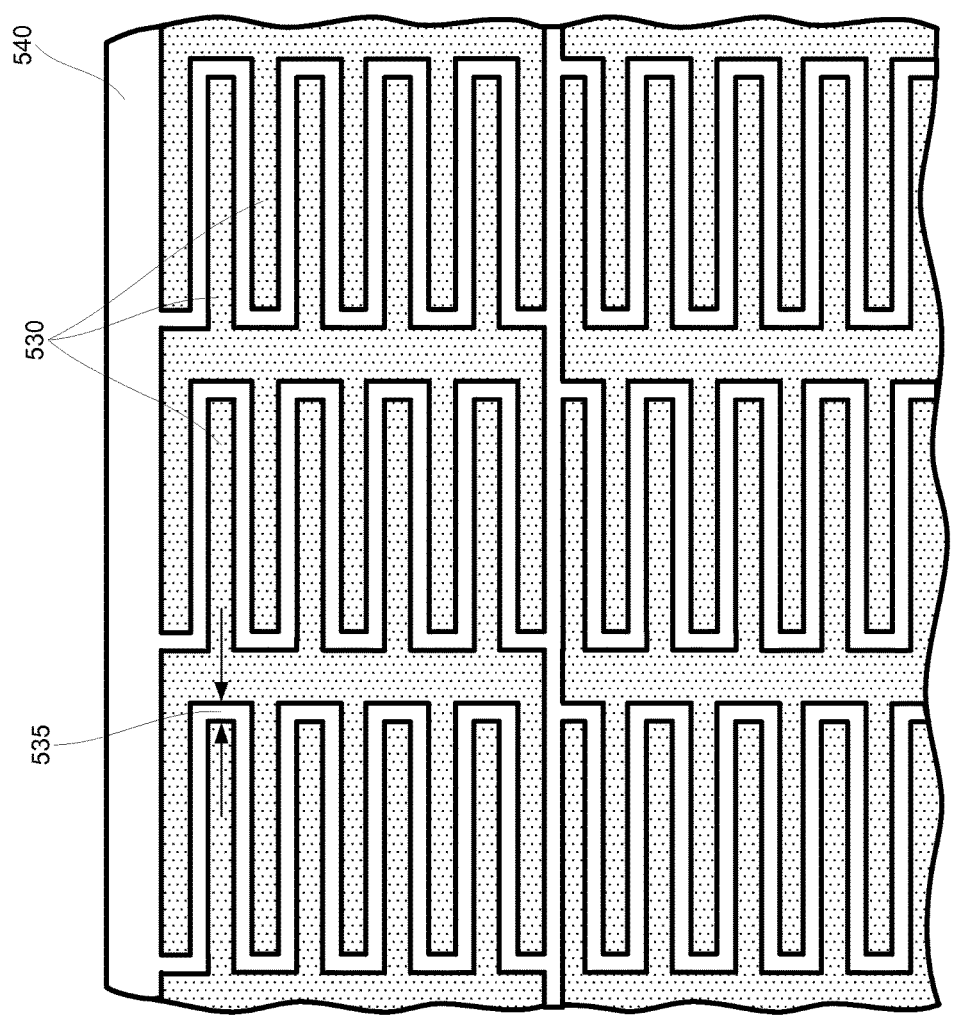

In parallel to the steps depicted in FIGS. 5A-5B, in FIG. 5C a patterned adhesive layer 530 is printed on a roll or sheet of insulating layer 540. The pattern of the patterned adhesive layer 530 may be designed to approximately match the pattern of interdigitated fingers 520, although in some embodiments the size of the features of the patterned adhesive layer 530 may be slightly reduced (and, therefore, the size of the adhesive gaps 535 in which no adhesive is printed may be slightly increased) relative to the size of the features in the interdigitated fingers 520. For example, in some embodiments, the size of the adhesive gaps 535 may be between 100% and 250% of the size of the gaps 525 between the interdigitated fingers. In another embodiment, the size of the adhesive gaps 535 may be between 100% and 150% of the size of the gaps 525 (e.g., if the size of the gaps 525 is 2 mm, the size of the adhesive gaps 535 may be between 2 and 3 mm). The increased size of the adhesive gaps 535 relative to the gaps 525 helps create a tolerance that ensures that the patterned adhesive layer 530 is only bonded to desired regions of conductive foil 500, as described below.

While the adhesive that attaches the conductive foil 500 to the carrier substrate 510 in FIG. 5A is preferably of a temporary or low-tack nature, the patterned adhesive layer 530 shown in FIG. 5C is ideally of a near-permanent or high-tack nature. The patterned adhesive layer 530 may comprise adhesive types including, but not limited to, pressure sensitive adhesives, contact adhesives, thermoplastic adhesives, thermoset adhesives, cross-linking adhesives, UV curable adhesives, or two-component adhesives. In one embodiment, the patterned adhesive layer 530 comprises a cross-linking adhesive that may be thermally cured.

Figure 5D:
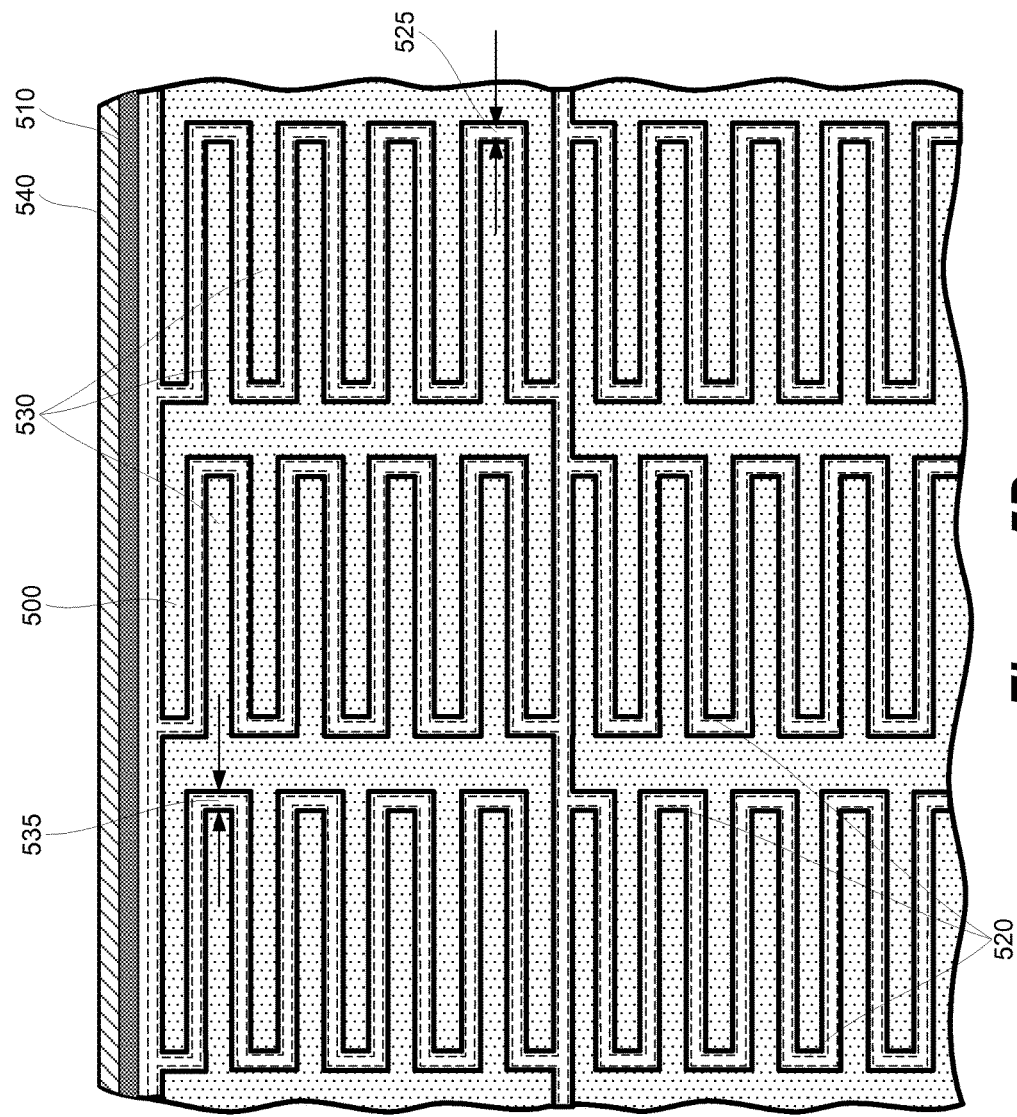

In FIG. 5D, the insulating layer 540 is attached to the exposed surface of the conductive foil 500 (i.e., the surface of the conductive foil 500 opposite the carrier substrate 510) via the patterned adhesive layer 530. The patterned adhesive layer 530 may be aligned to the kiss cut pattern of interdigitated fingers 520 using an in-line lamination apparatus that includes a vision alignment system, for example. The lamination apparatus may further include a curing station (e.g., thermal or UV) to activate the patterned adhesive layer 530. During the lamination step, care may be taken to prevent the patterned adhesive layer 530 from bonding to regions of conductive foil that occupy the gaps 525 between the interdigitated fingers 520. In some embodiments, the larger size of the adhesive gaps 535 relative to the gaps 525 provides a tolerance to help ensure that this does not occur.

Figure 5E:
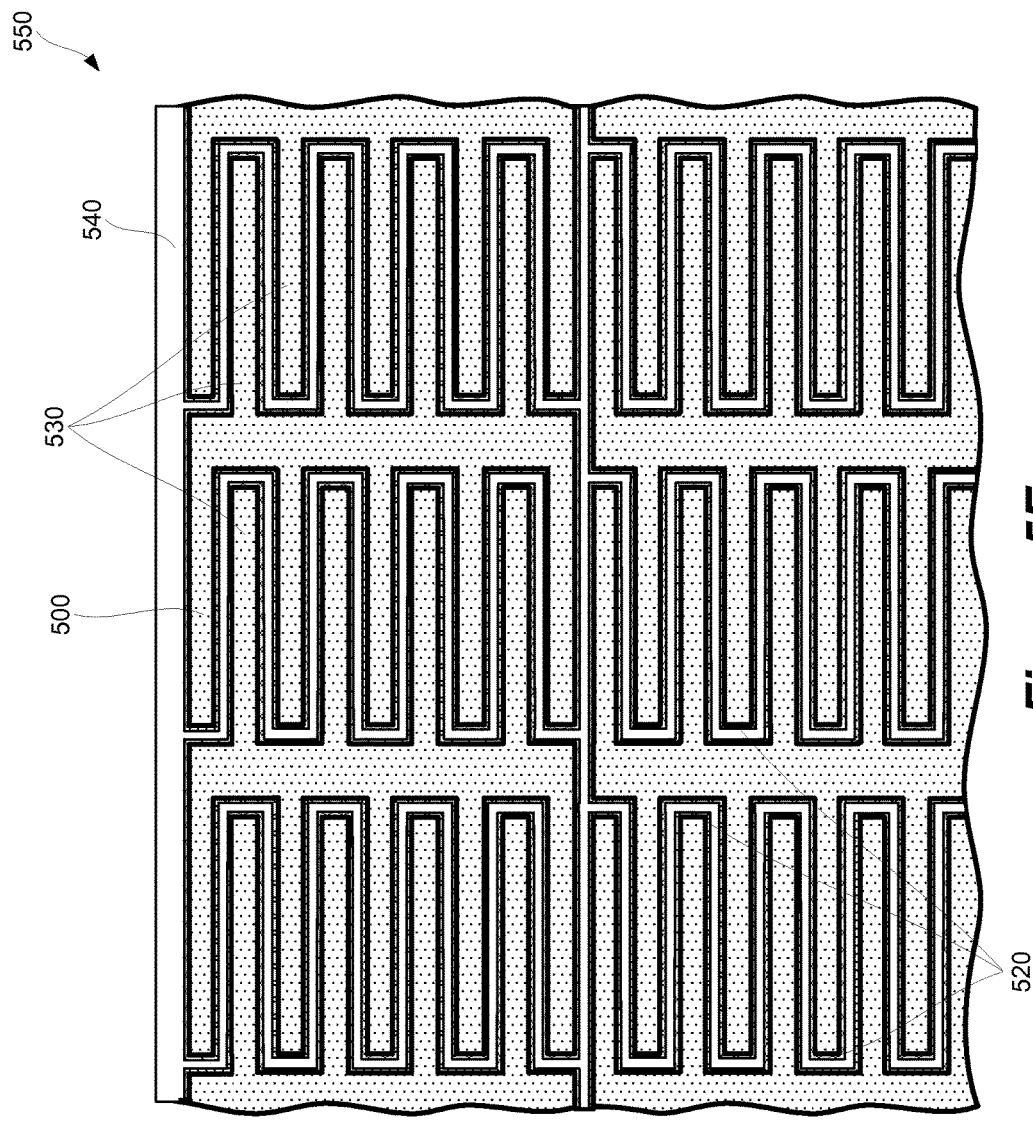

Next, the carrier substrate 510 and the regions of conductive foil 500 that occupy the gaps 525 are peeled away from the insulating layer 540 and interdigitated fingers 520 to form a roll of mechanically supported, patterned foil 550, as shown in FIG. 5E. (Note that although the example shown in FIG. 5E depicts a view through the insulating layer, the insulating layer need not be transparent in general.) Whereas the interdigitated fingers 520 are induced to stay attached to the insulating layer 540 because they are bonded to the high-tack patterned adhesive layer 530, the regions of conductive foil occupying the gaps are not in contact with the patterned adhesive layer 530 and instead remain attached to the low-tack carrier substrate as it is peeled away.

As in other embodiments, if the conductive foil 500 and insulating layer 540 are provided in roll form, the roll may next be cut into discrete sheets to form interconnect circuits (not shown). In addition, connecting busbars may optionally be attached to alternating ends of adjacent series-connected strings as desired. Furthermore, at various stages of the process a surface finish may be applied to the exposed surfaces of the conductive foil 500 to prevent long-term oxidation and/or corrosion, as described elsewhere.

As in other embodiments, the completed interconnect circuit may optionally be attached to a protective backsheet in either the base configuration or in the upside-down configuration. In the upside-down configuration, in some embodiments the insulating layer 540 may be patterned with an array of openings corresponding to the contacts of a rear-contact solar cell prior to its attachment to the conductive foil 500. In addition, the insulating layer 540 may optionally be laminated to a second adhesive layer (not shown) on a side opposite the patterned adhesive layer 530, prior to its patterning and/or attachment to the conductive foil 500.

There are at least two potential advantages to the use of the carrier substrate as a supportive substrate for patterning the conductive foil 500 prior to the attachment of the insulating layer 540. First, whereas the carrier substrate may be made relatively thick (e.g., 50-100 microns thick, as described above) to provide a tolerance for the kiss cutting step, the insulating layer 540 may be kept relatively thin since it is attached only after the kiss cutting step has been carried out. In some embodiments, this may be particularly useful in the upside-down configuration in which a thin insulating layer may be desired. For example, the use of the carrier substrate may enable an insulating layer thinner than about 50 microns to be implemented in the interconnect circuit. In other embodiments, the insulating layer thickness may be about 25 microns or less. In still other embodiments, the insulating layer thickness may be about 12.5 microns or less.

Second, the presence of a supportive carrier substrate 510 in the peeling step depicted in FIGS. 5D-5E helps ensure that the undesired regions of conductive foil 500 may be peeled away from the interdigitated fingers 520 without tearing the foil. This may help increase the overall yield of the interconnect circuit fabrication process. This approach may be of particular benefit when A) the kiss cut pattern in the conductive foil is complex; B) there is a high number of fingers per set of interdigitated fingers or per rear-contact solar cell; or C) the spacing in between the fingers is narrow, as these are typically the conditions in which unsupported conductive foil would be most likely to tear during removal. In some embodiments, the use of carrier substrate 510 may enable a periodicity in the interdigitated fingers of less than about 3 cm (i.e., a finger-to-finger spacing of 1.5 cm or less). In other embodiments, the periodicity may be about 2 cm or less. In still other embodiments, the periodicity may be about 1.5 cm or less.

The methods and devices described herein may be extended to the interconnection of electronic devices in general, including but not limited to integrated circuits, resistors, capacitors, inductors, batteries, and other electronic components and/or power sources. The various embodiments of the invention could potentially provide advantages in terms of scalability, production cost and/or throughput.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

What is claimed is:

1. An interconnect circuit comprising:
 a patterned conductive foil comprising a front surface and a rear surface,
 wherein the patterned conductive foil comprises two sets of interdigitated fingers,
 wherein the interdigitated fingers in each set of interdigitated fingers are defined by a series of consecutive slots, each slot comprising a first end and a second end,
 wherein, for each slot of at least a portion of the series of consecutive slots of each set of interdigitated fingers, a first gap connects the first end of the slot to the first end of a first consecutive slot and a second gap connects the second end of the slot to the second end of a second consecutive slot;
 wherein the two sets of interdigitated fingers are electrically isolated from each other by the series of consecutive slots and corresponding first gaps and second gaps; and
 wherein the two sets of interdigitated fingers are configured to overlap with contacts of a rear-contact cell;
 an insulating layer for electrically isolating the patterned conductive foil from the rear-contact cell,
 wherein the front surface of the patterned conductive foil is laminated to the insulating layer,
 wherein the patterned conductive foil is mechanically supported by the insulating layer, thereby maintaining electrical isolation between the two sets of interdigitated fingers, and
 wherein the insulating layer comprises a first set of openings patterned for allowing electrical connections between the two sets of interdigitated fingers and the contacts of the rear-contact cell,
 wherein the insulating layer comprises a second set of openings aligned with the first gaps and the second gaps;
 an adhesion-promoting tie layer covering the rear surface of the patterned conductive foil such that the patterned conductive foil is disposed between the adhesion-promoting tie layer and the insulating layer; and
 a backsheet adhesive layer covering the adhesion-promoting tie layer such that the adhesion-promoting tie layer is disposed between the backsheet adhesive layer and the patterned conductive foil.

2. The interconnect circuit of claim 1, further comprising an interconnect circuit adhesive layer disposed on the insulating layer such that the insulating layer is disposed between the interconnect circuit adhesive layer and the patterned conductive foil, wherein the interconnect circuit adhesive layer comprises openings patterned for allowing electrical connections between the two sets of interdigitated fingers and the contacts of the rear-contact cell.

3. The interconnect circuit of claim 2, wherein the interconnect circuit adhesive layer is less than approximately 100 microns thick.

4. The interconnect circuit of claim 2, wherein the interconnect circuit adhesive layer has a melt flow index of less than approximately 8 dg/min.

5. The interconnect circuit of claim 2, wherein the interconnect circuit adhesive layer is electrically insulating.

6. The interconnect circuit of claim 2, wherein the interconnect circuit adhesive layer comprises a pigment for increasing a reflectivity of the interconnect circuit.

7. The interconnect circuit of claim 2, wherein the interconnect circuit adhesive layer is less than approximately 50 microns thick.

8. The interconnect circuit of claim 2, wherein the interconnect circuit adhesive layer is a cross-linking adhesive.

9. The interconnect circuit of claim 2, wherein the interconnect circuit adhesive layer is a thermoplastic adhesive.

10. The interconnect circuit of claim 1, wherein the patterned conductive foil comprises aluminum.

11. The interconnect circuit of claim 10, wherein the patterned conductive foil has a thickness of approximately 100 microns or less.

12. The interconnect circuit of claim 10, wherein the patterned conductive foil has a thickness of approximately 50 microns.

13. The interconnect circuit of claim 1, wherein the patterned conductive foil comprises a surface finish selected from the group consisting of tin, lead, zinc, nickel, silver, palladium, gold, indium, chrome, copper, and an organic solderability preservative.

14. The interconnect circuit of claim 1, further comprising at least one busbar connected to the rear surface of the patterned conductive foil.

15. The interconnect circuit of claim 14, further comprising an external connector electrically connected to the at least one busbar.

16. The interconnect circuit of claim 1, further comprising the rear-contact cell such that the insulating layer is disposed between the rear-contact cell and the patterned conductive foil.

17. The interconnect circuit of claim 16, further comprising electrical connections, wherein each electrical connection occupies the first set of openings in the insulating layer and makes contact with the rear-contact cells, and wherein the electrical connections comprise a material selected from the group consisting of a solder, a solder paste, a conductive ink, an isotropic electrically conductive adhesive (ECA), an anisotropic ECA, and a bulk metallic conductor.

18. The interconnect circuit of claim 17, wherein the electrical connections comprise a corrosion inhibitor.

19. The interconnect circuit of claim 16, wherein a width of the insulating layer is within 20% of a width of a rear-contact cell.

20. The interconnect circuit of claim 1, wherein each of the first set of openings in the insulating layer fully overlaps with the patterned conductive foil.

21. The interconnect circuit of claim 1, wherein the insulating layer is operable as a planarization layer between the patterned conductive foil and the rear-contact cell to remove gaps and smooth features in the patterned conductive foil.

22. The interconnect circuit of claim 1, wherein the patterned conductive foil comprises a pattern for in-plane stress relief.

23. The interconnect circuit of claim 1, wherein the insulating layer has a thickness of about 25 microns or less.

24. The interconnect circuit of claim 1, wherein the insulating layer has a thickness of about 12.5 microns or less.

25. The interconnect circuit of claim 1, wherein the insulating layer comprises polyethylene terephalate (PET).

* * * * *